United States Patent
Zhu

(10) Patent No.: US 12,477,750 B2
(45) Date of Patent: Nov. 18, 2025

(54) NOR-TYPE MEMORY DEVICE, METHOD OF MANUFACTURING NOR-TYPE MEMORY DEVICE, AND ELECTRONIC APPARATUS INCLUDING MEMORY DEVICE

(71) Applicant: INSTITUTE OF MICROELECTRONICS, CHINESE ACADEMY OF SCIENCES, Beijing (CN)

(72) Inventor: Huilong Zhu, Poughkeepsie, NY (US)

(73) Assignee: INSTITUTE OF MICROELECTRONICS, CHINESE ACADEMY OF SCIENCES, Beijing (CN)

( * ) Notice: Subject to any disclaimer, the term of this patent is extended or adjusted under 35 U.S.C. 154(b) by 388 days.

(21) Appl. No.: 18/042,651

(22) PCT Filed: Jul. 5, 2022

(86) PCT No.: PCT/CN2022/103806
§ 371 (c)(1),
(2) Date: Feb. 23, 2023

(87) PCT Pub. No.: WO2023/011083
PCT Pub. Date: Feb. 9, 2023

(65) Prior Publication Data
US 2023/0337442 A1    Oct. 19, 2023

(30) Foreign Application Priority Data
Aug. 2, 2021    (CN) .......................... 202110883409.2

(51) Int. Cl.
*H10B 80/00* (2023.01)
*H01L 25/00* (2006.01)
(Continued)

(52) U.S. Cl.
CPC ......... *H10B 80/00* (2023.02); *H01L 25/0657* (2013.01); *H01L 25/18* (2013.01);
(Continued)

(58) Field of Classification Search
CPC ........ H10B 41/23; H10B 43/50; H10B 43/40; H10B 43/35; H10B 43/23
See application file for complete search history.

(56) References Cited

U.S. PATENT DOCUMENTS 10,608,011 B2 *   3/2020   Harari .................. H01L 23/562
10,910,364 B2 *   2/2021   Or-Bach ............... H10B 12/09
(Continued)

FOREIGN PATENT DOCUMENTS

CN     111769116 A     10/2020
CN     111801798 A     10/2020
(Continued)

OTHER PUBLICATIONS

Extended European Search Report for corresponding International Application No. PCT/CN2022/103806, dated Oct. 21, 2024, 12 pages.
(Continued)

*Primary Examiner* — Yara B Green
*Assistant Examiner* — Erika H Son
(74) *Attorney, Agent, or Firm* — Westman, Champlin & Koehler, P.A.

(57) ABSTRACT

Disclosed are a NOR-type memory device and an electronic apparatus. The NOR-type memory device includes a NOR cell array and a peripheral circuit. The NOR cell array includes: a first substrate; an array of memory cells on the first substrate, wherein each memory cell includes a first gate stack extending vertically with respect to the first substrate and an active region surrounding a periphery of the first gate stack; first bonding pads electrically connected to the first
(Continued)

gate stacks; and second bonding pads electrically connected to the active regions. The peripheral circuit includes: a second substrate; peripheral circuit elements on the second substrate; and third bonding pads, wherein at least some of the third bonding pads are electrically connected to the peripheral circuit elements. At least some of the first bonding pads and the second bonding pads are opposite to at least some of the third bonding pads.

22 Claims, 28 Drawing Sheets

(51) Int. Cl.
| | | |
|---|---|---|
| *H01L 25/065* | (2023.01) | |
| *H01L 25/18* | (2023.01) | |
| *H10B 43/27* | (2023.01) | |
| *H10B 43/30* | (2023.01) | |
| *H10B 43/40* | (2023.01) | |
| *H10B 51/20* | (2023.01) | |
| *H10B 51/30* | (2023.01) | |
| *H10B 51/40* | (2023.01) | |

(52) U.S. Cl.
CPC ............. *H01L 25/50* (2013.01); *H10B 43/27* (2023.02); *H10B 43/30* (2023.02); *H10B 43/40* (2023.02); *H10B 51/20* (2023.02); *H10B 51/30* (2023.02); *H10B 51/40* (2023.02); *H01L 2225/06513* (2013.01); *H01L 2225/06541* (2013.01)

(56) References Cited

U.S. PATENT DOCUMENTS

| | | | | |
|---|---|---|---|---|
| 11,302,396 | B2* | 4/2022 | Kwon | G11C 16/0483 |
| 11,574,922 | B2 | 2/2023 | Zhang et al. | |
| 11,723,206 | B2* | 8/2023 | Lee | G11C 13/0069 |
| | | | | 365/185.28 |
| 12,096,630 | B2* | 9/2024 | Cernea | H01L 21/30604 |
| 12,245,429 | B2* | 3/2025 | Petti | H10B 43/40 |
| 2011/0140070 | A1* | 6/2011 | Kim | G11C 11/5678 |
| | | | | 257/E27.002 |
| 2014/0169105 | A1 | 6/2014 | Oh | |
| 2020/0098738 | A1 | 3/2020 | Herner et al. | |
| 2021/0065801 | A1 | 3/2021 | Kwon et al. | |
| 2021/0143096 | A1 | 5/2021 | Yun et al. | |
| 2021/0210498 | A1 | 7/2021 | Leobandung | |
| 2021/0375912 | A1 | 12/2021 | Zhang et al. | |
| 2022/0285506 | A1 | 9/2022 | Zhu | |
| 2022/0383953 | A1* | 12/2022 | Kamisaka | H10D 30/6757 |

FOREIGN PATENT DOCUMENTS

| | | |
|---|---|---|
| CN | 112614854 A | 4/2021 |
| CN | 112909010 A | 6/2021 |
| CN | 112909011 A | 6/2021 |
| CN | 112909012 A | 6/2021 |
| CN | 112909015 A | 6/2021 |
| CN | 113707667 A | 11/2021 |

OTHER PUBLICATIONS

English translation of first Office Action, for Chinese Patent Application No. 202110883409.2, dated Jan. 28, 2023, 10 pages.
First Korean Action, including Search Report, for Korean Patent Application No. 10-2023-7010557, dated Apr. 4, 2024, 12 pages.
International Search Report and Written Opinion for International Application No. PCT/CN2022/103806, dated Sep. 14, 2022.
First Office Action, for Chinese Patent Application No. 202110883409.2, dated Jan. 28, 2023, 9 pages.
Extended European Search Report for corresponding European Application No. 22851798.3, dated Oct. 21, 2024, 12 pages.

* cited by examiner

NOR-TYPE MEMORY DEVICE, METHOD OF MANUFACTURING NOR-TYPE MEMORY DEVICE, AND ELECTRONIC APPARATUS INCLUDING MEMORY DEVICE

CROSS REFERENCE TO RELATED APPLICATION(S)

This application is a Section 371 National Stage Application of International Application No. PCT/CN2022/103806, filed on Jul. 5, 2022, entitled "NOR-type memory device, method of manufacturing NOR-type memory device, and electronic apparatus including memory device", which published as WIPO Publication No. 2023/011083 A1, filed on Feb. 9, 2023, not in English, which_claims priority to Chinese Patent Application No. 202110883409.2, filed on Aug. 2, 2021, the entire contents of which are incorporated herein by reference in their entireties.

TECHNICAL FIELD

The present disclosure relates to a field of semiconductors, in particular to a NOR-type memory device, a method of manufacturing the NOR-type memory device, and an electronic apparatus including the memory device.

BACKGROUND

In a planar device such as a Metal Oxide Semiconductor Field Effect Transistor (MOSFET), a source, a gate and a drain are arranged in a direction substantially parallel to a substrate surface. Due to such an arrangement, the planar device is difficult to be further scaled down. In contrast, in a vertical device, a source, a gate and a drain are arranged in a direction substantially perpendicular to a substrate surface. As a result, the vertical device is easier to be scaled down compared to the planar device.

Vertical devices may be stacked to increase the integration density. However, this may lead to poor performance. Because in order to stack a plurality of devices conveniently, polycrystalline silicon is usually used as a channel material, resulting in a greater resistance compared with using monocrystalline silicon as the channel material. In addition, it is also desirable to achieve a high bandwidth connection between memory cells and a peripheral circuit.

SUMMARY

In view of this, an objective of the present disclosure is at least partially to provide a NOR-type memory device with an improved performance, a method of manufacturing the NOR-type memory device, and an electronic apparatus including the memory device.

According to an aspect of the present disclosure, a NOR-type memory device is provided, including a NOR cell array and a peripheral circuit. The NOR cell array may include: a first substrate; an array of memory cells on the first substrate, wherein each memory cell includes a first gate stack extending vertically with respect to the first substrate and an active region surrounding a periphery of the first gate stack; first bonding pads electrically connected to the first gate stacks; and second bonding pads electrically connected to the active regions of the memory cells. The peripheral circuit may include: a second substrate; peripheral circuit elements on the second substrate; and third bonding pads, wherein at least one or more of the third bonding pads is electrically connected to the peripheral circuit elements. The NOR cell array and the peripheral circuit are arranged such that at least one or more of the first bonding pads and the second bonding pads is opposite to at least one or more of the third bonding pads.

According to another aspect of the present disclosure, an electronic apparatus is provided, including the NOR-type memory device described above.

According to the embodiments of the present disclosure, the memory cell array may be bonded with the peripheral circuit, so as to achieve a high bandwidth connection therebetween. In addition, a three-dimensional (3D) NOR-type memory device may be constructed by using a stack of monocrystalline material as a constructing block. Therefore, when a plurality of memory cells are stacked, an increase in resistance may be suppressed.

BRIEF DESCRIPTION OF THE DRAWINGS

The above and other objectives, features and advantages of the present disclosure will be more apparent through the following description of the embodiments of the present disclosure with reference to the accompanying drawings, in which:

FIG. 1(a) to FIG. 1(d) show schematic diagrams of a NOR cell array according to embodiments of the present disclosure, wherein FIG. 1(a) is a top view, in which positions of line AA' and line BB' are shown, FIG. 1(b) is a cross-sectional view taken along line AA', FIG. 1(c) is a cross-sectional view taken along line BB', and FIG. 1(d) is an equivalent circuit diagram;

FIG. 2(a) and FIG. 2(b) show schematic diagrams of a NOR-type memory device according to embodiments of the present disclosure, wherein FIG. 2(a) is a cross-sectional view taken along line AA', and FIG. 2(b) is a cross-sectional view taken along line BB';

FIG. 4(a) and FIG. 4(b) show schematic diagrams of a NOR-type memory device according to other embodiments of the present disclosure, wherein FIG. 4(a) is a cross-sectional view taken along line AA', and FIG. 4(b) is a cross-sectional view taken along line BB';

FIG. 5(a) and FIG. 5(b) show schematic diagrams of a NOR-type memory device according to other embodiments of the present disclosure, wherein FIG. 5(a) is a cross-sectional view taken along line AA', and FIG. 5(b) is a cross-sectional view taken along line BB';

FIG. 6 to FIG. 24(b) show schematic diagrams of some stages in a process of manufacturing a NOR-type memory device according to other embodiments of the present disclosure, wherein FIGS. 19(b), 20(b), 21(b), 22(c), 23(c) and 24(b) are cross-sectional views taken along line BB'.

Throughout the accompanying drawings, the same or similar reference numbers may denote the same or similar elements.

DETAILED DESCRIPTION OF EMBODIMENTS

Embodiments of the present disclosure will be described below with reference to the accompanying drawings. It should be understood, however, that these descriptions are merely exemplary and are not intended to limit the scope of the present disclosure. In addition, in the following, descriptions of well-known structures and technologies are omitted to avoid unnecessarily obscuring the concepts of the present disclosure.

Various schematic structural diagrams according to the embodiments of the present disclosure are shown in the accompanying drawings. The figures are not drawn to scale. Some details are enlarged and some details may be omitted for clarity of presentation. The shapes of the various regions and layers as well as the relative size and positional relationship thereof shown in the figures are merely exemplary. In practice, there may be deviations due to manufacturing tolerances or technical limitations, and those skilled in the art may additionally design regions/layers with different shapes, sizes and relative positions according to actual needs.

In the context of the present disclosure, when a layer/element is referred to as being located "on" a further layer/element, the layer/element may be located directly on the further layer/element, or there may be an intermediate layer/element between them. In addition, if a layer/element is located "on" a further layer/element in one orientation, the layer/element may be located "under" the further layer/element when the orientation is reversed.

The present disclosure may be presented in various forms, some examples of which will be described below. A selection of various materials is involved in the following descriptions. In selecting the materials, in addition to the function of the materials (for example, a semiconductor material may be used to form the active region, a dielectric material may be used to form an electrical isolation, and a conductive material may be used to form an electrode, an interconnection structure, etc.), the etching selectivity is considered. In the following descriptions, a required etching selectivity may or may not be indicated. It should be clear to those skilled in the art that when etching a material layer is mentioned below, if it is not mentioned or shown that other layers are also etched, then the etching may be selective, and the material layer may have an etching selectivity relative to other layers exposed to a same etching formula.

FIG. 1(a) to FIG. 1(d) show schematic diagrams of a NOR cell array according to embodiments of the present disclosure.

Figure 1A:
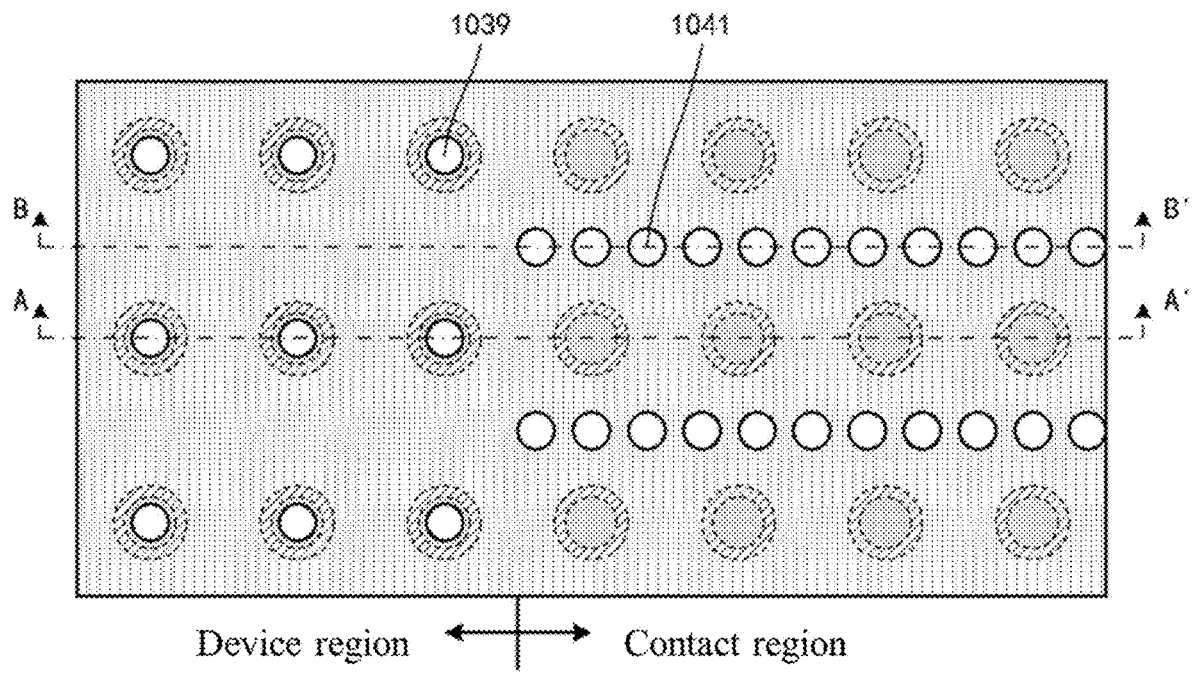
Figure 1B:
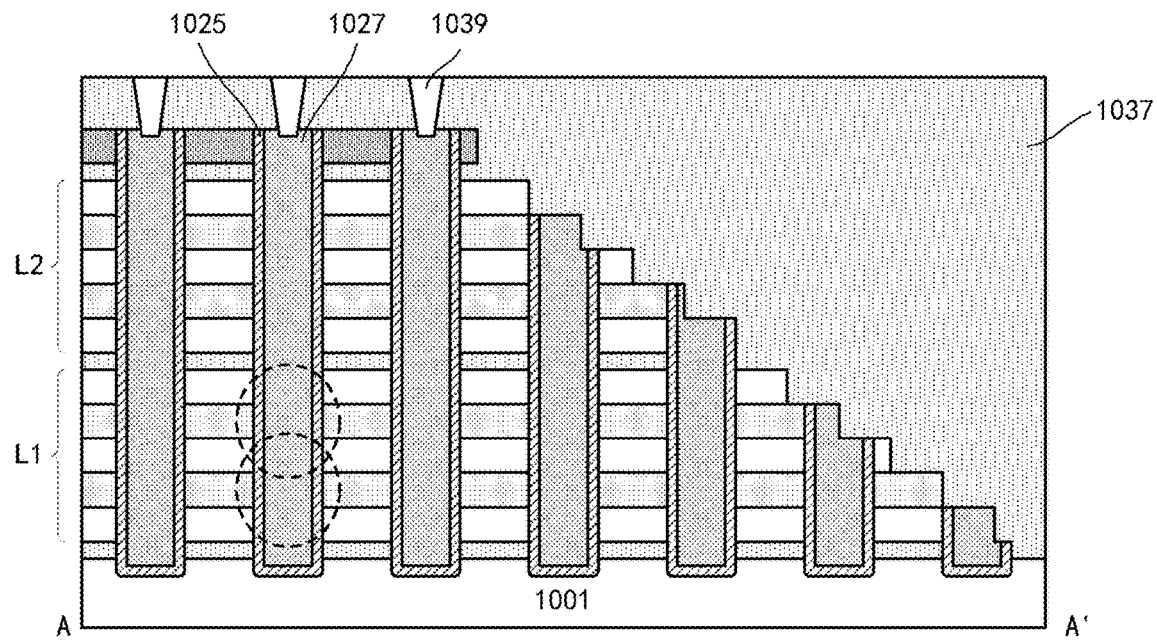
Figure 1C:
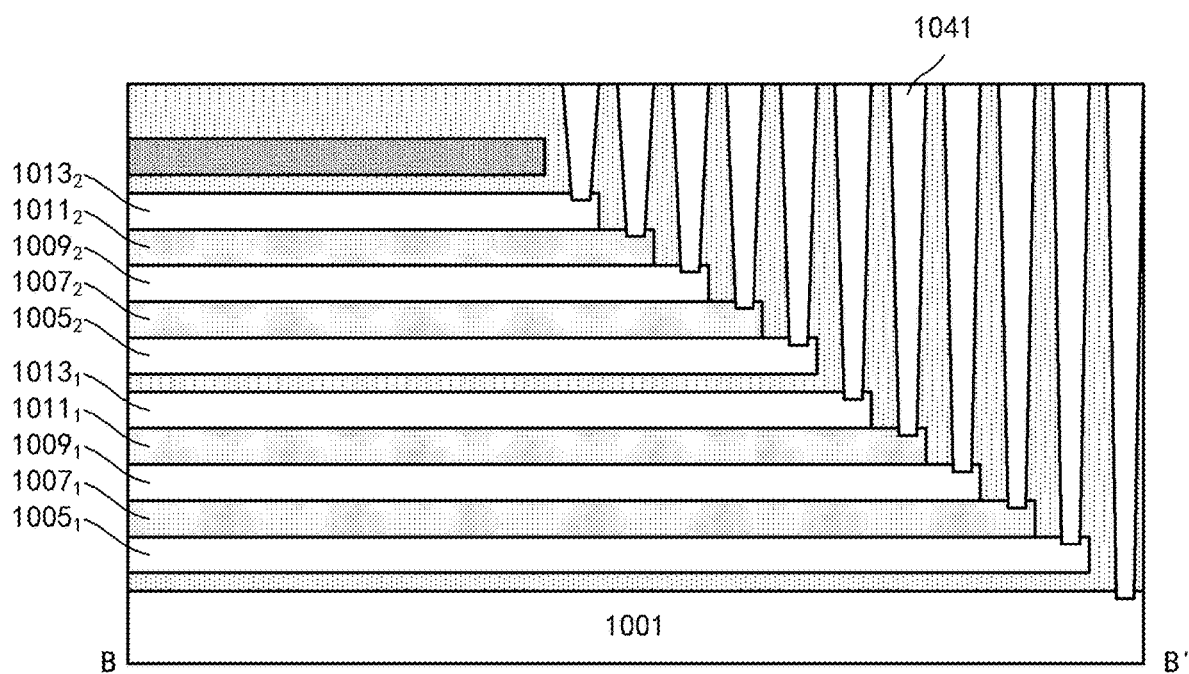

As shown in FIG. 1(a) to FIG. 1(c), a NOR cell array may be formed on a substrate 1001. Device layers L1 and L2 are stacked on the substrate 1001. For example, the device layer L1 may include a first source/drain layer $1005_1$ for defining a source/drain region, a first channel layer $1007_1$ for defining a channel region, a second source/drain layer $1009_1$ for defining a source/drain region, a second channel layer $1011_1$ for defining a channel region, and a third source/drain layer $1013_1$ for defining a source/drain region. The device layer L2 may similarly include a first source/drain layer $1005_2$, a first channel layer $1007_2$, a second source/drain layer $1009_2$, a second channel layer $1011_2$, and a third source/drain layer $1013_2$. Only two device layers are shown in the figures, but the present disclosure is not limited thereto and may include fewer (e.g., one) or more (e.g., three or even more) device layers. The device layer and the substrate may be separated from each other by an isolation layer, and the device layers may be separated from each other by an isolation layer. Here, the isolation layers are shown integrally with an interlayer insulation layer 1037.

A gate stack including a memory functional layer 1025 and a gate conductor layer 1027 may extend vertically to pass through the device layers L1 and L2 (especially in a device region). The memory functional layer 1025 may be based on a dielectric charge trapping, a ferroelectric material effect, or a bandgap engineering charge storage (SONOS), etc.

As shown in FIG. 1(b), the gate stack (1025/1027) including the memory functional layer is surrounded by an active region. The gate stack may cooperate with the active region (a stack of the source/drain layer, the channel layer and the source/drain layer) to define a memory cell, as shown by dashed circles in FIG. 1(b). The channel region formed in the channel layer may be connected to the source/drain regions formed in the source/drain layers at opposite ends of the channel region, and the channel region may be controlled by the gate stack.

The gate stack may extend in a column shape in a vertical direction and overlap with a plurality of device layers, so as to define a plurality of memory cells stacked on each other in the vertical direction. The memory cells associated with a single gate stack column may form a memory cell string. Corresponding to an arrangement of gate stack columns, a plurality of such memory cell strings are arranged on the substrate, so that a three-dimensional (3D) array of memory cells is formed.

In such embodiments, a single gate stack column may define two memory cells in a single device layer, as shown by two dashed circles in the device layer L1 in FIG. 1(b). In the NOR-type memory device, the two memory cells may share the same source/drain layer (the second source/drain layer $1009_1$ or $1009_2$ in the middle) and may be electrically connected to a source line. In addition, the two memory cells may be electrically connected to bit lines through upper and lower source/drain layers (the first source/drain layer $1005_1$ or $1005_2$ and the third source/drain layer $1013_1$ or $1013_2$) respectively.

A stepped structure may be formed in a contact region, so that in each device layer, each layer to be electrically connected such as the above described source/drain layer and optionally channel layer, has an end portion protruded with respect to the upper layer, so as to define a landing pad of a contact portion to the layer.

The interlayer insulation layer 1037 covers the array of memory cells, and contact portions 1039 and 1041 may be formed in the interlayer insulation layer 1037. Specifically, the contact portion 1039 may be formed in the device region and electrically connected to the gate conductor layer 1027 in the gate stack; the contact portion 1041 may be formed in the contact region and electrically connected to each source/drain layer and channel layer. The contact portions 1041 in the contact region may bypass the gate stack left in the contact region.

Figure 1D:
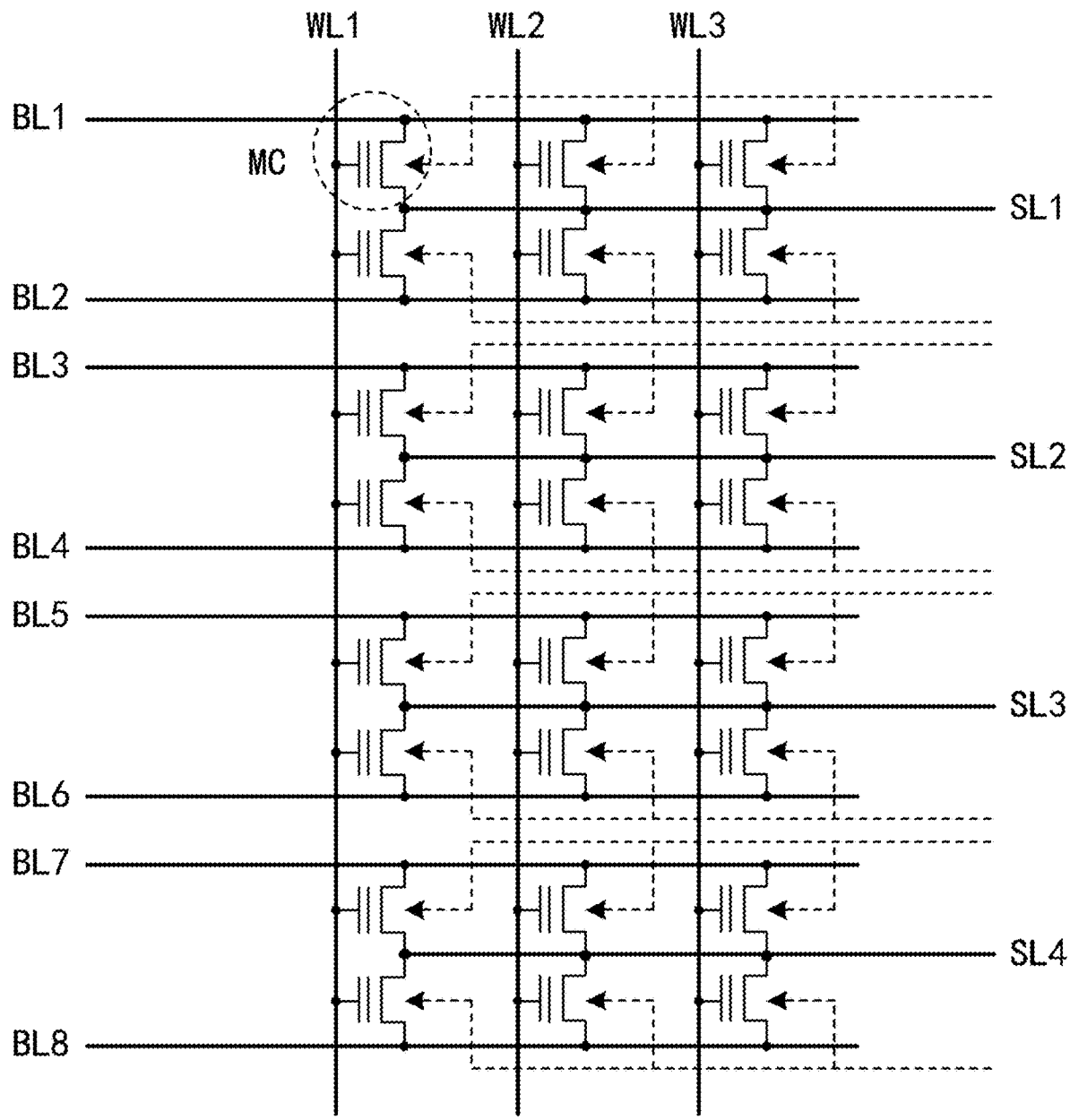

FIG. 1(d) schematically shows an equivalent circuit diagram of a NOR cell array according to embodiments of the present disclosure.

In the example of FIG. 1(d), three word lines WL1, WL2 and WL3 and eight bit lines BL1, BL2, BL3, BL4, BL5, BL6, BL7 and BL8 are schematically shown. However, the specific numbers of the bit lines and the word lines are not limited to this. A memory cell MC is provided at an intersection of the bit line and the word line. FIG. 1(d) further shows four source lines SL1, SL2, SL3 and SL4. As described above, memory cells in each two adjacent layers in the vertical direction may share a same source line connection. Furthermore, the source lines may be connected to each other, so that memory cells MC may be connected to a common source line. In addition, an optional bulk connection to each memory cell is schematically shown by a dashed line in FIG. 1(d). The bulk connection to each memory cell may be electrically connected to the source line connection for that memory cell.

Here, a two-dimensional array of memory cells MC is shown for convenience of illustration only. A plurality of such two-dimensional arrays may be arranged in a direction (for example, a direction perpendicular to the paper surface in the figures) intersecting the two-dimensional array, so as to obtain a three-dimensional array.

An extending direction of the word lines WL1 to WL3 in FIG. 1(d) may correspond to an extending direction of the gate stacks, i.e., the vertical direction with respect to the substrate in such embodiments. In that direction, adjacent bit lines are isolated from each other.

For further details, reference may be made to Chinese patent application 202110252927.4, in which the NOR cell array shown in FIG. 1(a) to FIG. 1(d) and a manufacture method thereof are described in detail.

Figure 2A:
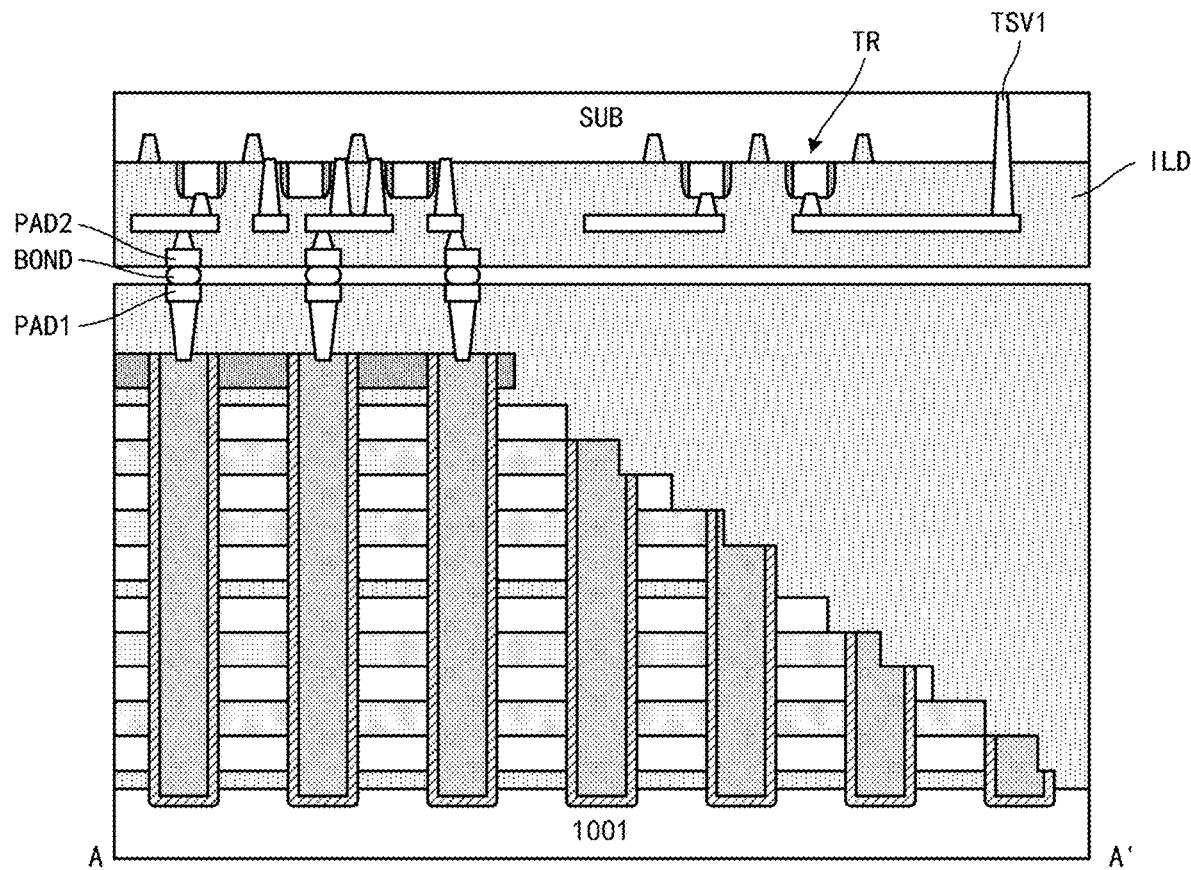
Figure 2B:
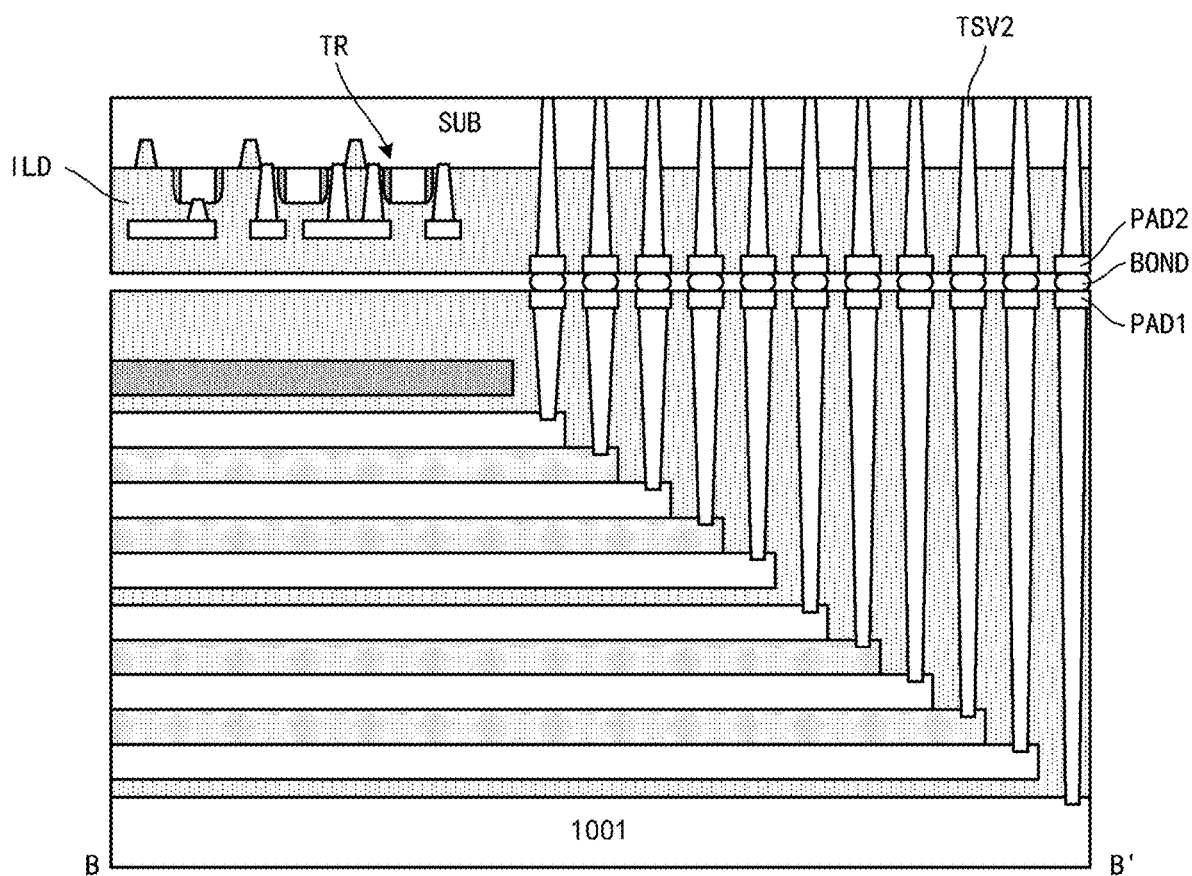

FIG. 2(a) and FIG. 2(b) show schematic diagrams of a NOR-type memory device according to embodiments of the present disclosure.

As shown in FIG. 2(a) and FIG. 2(b), a peripheral circuit is flip-chip mounted on the NOR cell array shown in FIG. 1(a) to FIG. 1(d). The peripheral circuit may include peripheral circuit elements TR, such as Metal Oxide Semiconductor Field Effect Transistors (MOSFETs) or the like, formed on a substrate SUB. The peripheral circuit elements TR may form various functional circuits through an interconnection structure (e.g., including via holes and interconnection lines) formed in an interlayer insulation layer ILD covering the peripheral circuit elements TR.

The interconnection structure may further include through silicon vias (TSVs) passing through the substrate SUB. The TSVs may be exposed from a surface of the substrate SUB facing away from the NOR cell array, so as to be electrically connected to other components. The TSVs, such as TSV1, may be electrically connected to the peripheral circuit elements TR; or the TSVs, such as TSV2, may not be electrically connected to the peripheral circuit elements TR, but may be used for other purposes such as achieving an electrical connection between the NOR cell array (for example, the contact portion 1041) and other components. The TSV2 may extend through the substrate SUB and the interlayer insulation layer ILD.

The NOR cell array may include bonding pads PAD1 for an electrical connection to the peripheral circuit and optionally to other components. The bonding pads PAD1 may be arranged on a surface (which may be referred to as a "top surface") of the interlayer insulation layer 1037 facing away from the substrate 1001. The bonding pads PAD1 may be electrically connected to the contact portions 1039 and 1041. For example, the bonding pads PAD1 may be arranged on the contact portions 1039 and 1041. The bonding pads PAD1 may be in direct contact with the contact portions 1039 and 1041, or other interconnection components may be provided therebetween. The bonding pad PAD1 may be embedded at least partially in the interlayer insulation layer 1037 or formed on the top surface of the interlayer insulation layer 1037, and a connection surface (for example, a surface facing the peripheral circuit) of the bonding pad PAD1 may be exposed on the top surface of the interlayer insulation layer 1037.

Similarly, the peripheral circuit may include bonding pads PAD2 for an electrical connection to the NOR cell array and optionally to other components. The bonding pads PAD2 may be arranged on a surface (which may be referred to as a "top surface") of the interlayer insulation layer ILD facing away from the substrate SUB. The bonding pads PAD2 may be electrically connected to corresponding components (e.g., contact portions and/or TSVs) of the interconnection structure of the peripheral circuit. For example, the bonding pad PAD2 may be arranged on a corresponding component of the interconnection structure. The bonding pad PAD2 may be in direct contact with the corresponding component, or other interconnection components may be provided therebetween. The bonding pad PAD2 may be embedded at least partially in the interlayer insulation layer ILD or formed on the top surface of the interlayer insulation layer ILD, and a connection surface (for example, a surface facing the NOR cell array) of the bonding pad PAD2 may be exposed on the top surface of the interlayer insulation layer ILD.

The bonding pad PAD1 and the bonding pad PAD2 may be provided corresponding to each other, so that they may face each other and thus may be connected to each other through a bonding component BOND when the peripheral circuit is flip-chip mounted on the NOR cell array. The bonding component BOND may include, for example, at least one of a bump, a solder ball, and the like.

In this example, the NOR cell array and the peripheral circuit are shown to have a same size in a transverse direction and to be fully aligned in the vertical direction. However, the present disclosure is not limited thereto. For example, the NOR cell array and the peripheral circuit may have different sizes in the transverse direction, or they may be offset from each other such that, for example, one or more of bonding pads PAD1 may not be covered by the peripheral circuit (or one or more of bonding pads PAD2 may not be covered by the NOR cell array), and thus may be electrically connected to other components by other bonding means (e.g., wire bonding).

Figure 3:
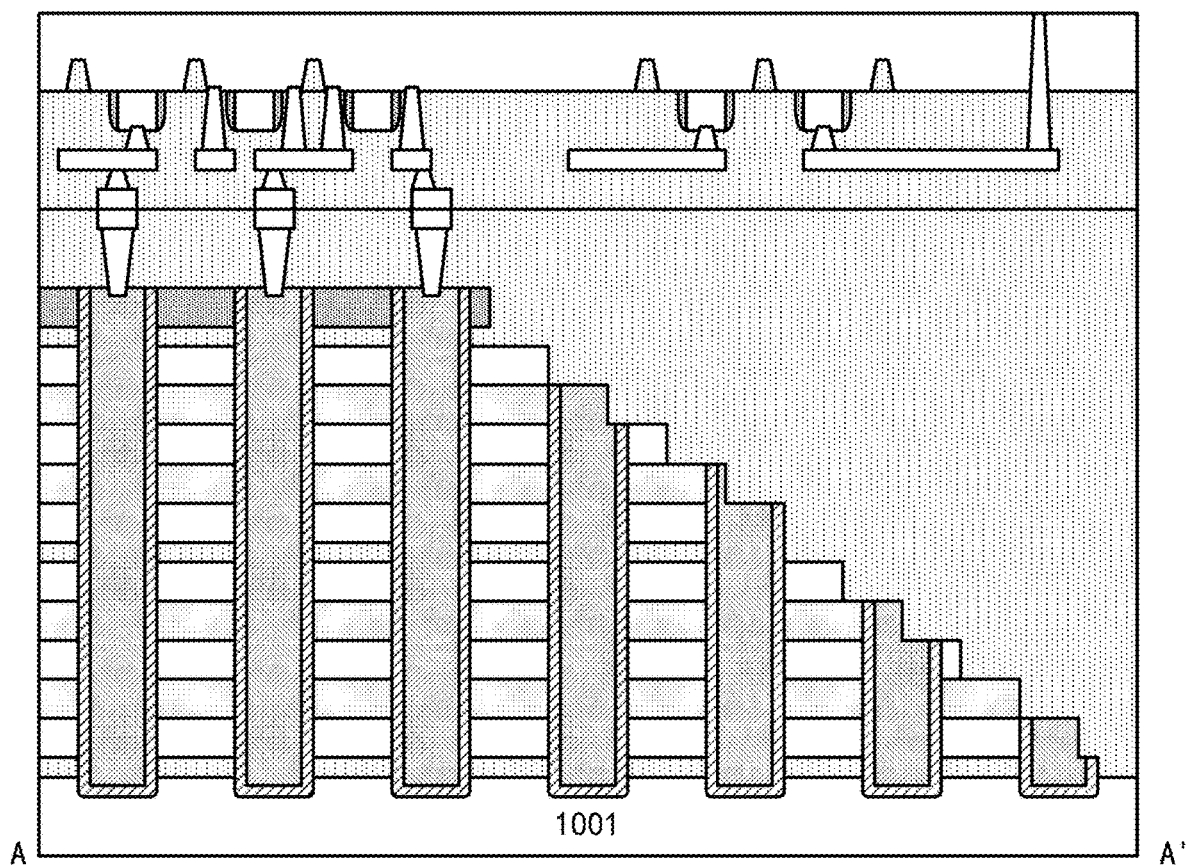
FIG. 3 shows a schematic diagram of a NOR-type memory device according to other embodiments of the present disclosure, which is a cross-sectional view taken along line AA'.

In the example shown in FIG. 2(a) and FIG. 2(b), the bonding pad PAD1 and the bonding pad PAD2 are bonded to each other by the bonding component BOND. However, the present disclosure is not limited thereto. For example, as shown in FIG. 3, the bonding pad PAD1 and the bonding pad PAD2 may be directly bonded to each other.

Figure 4A:
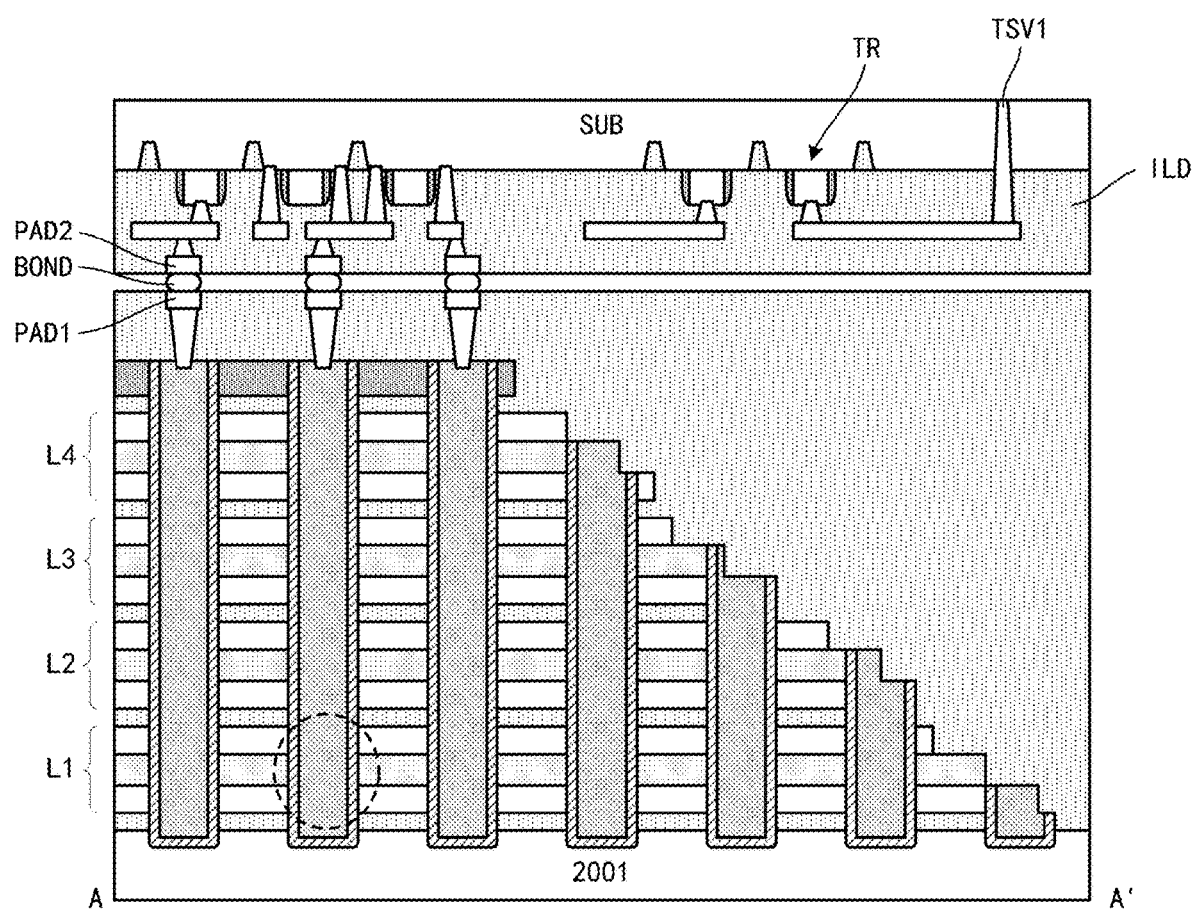
Figure 4B:
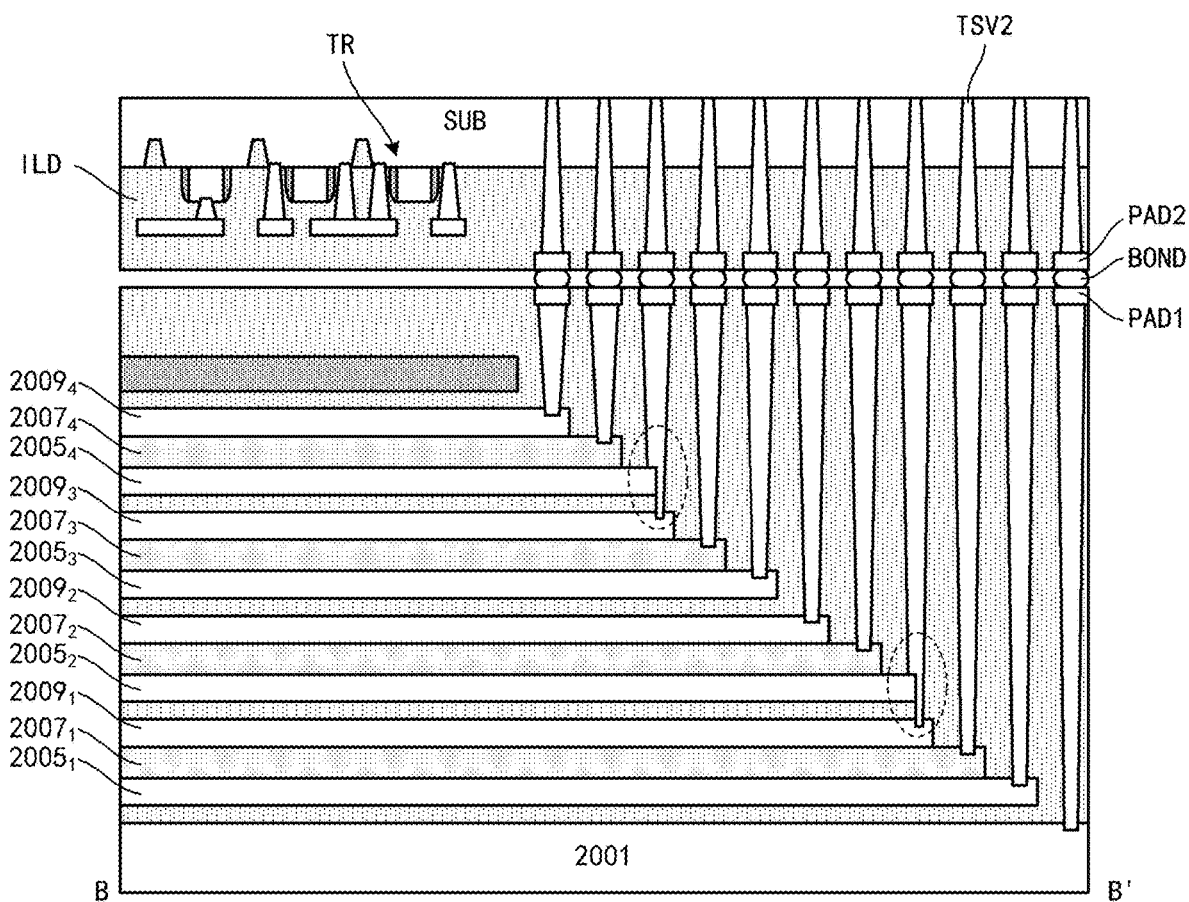

FIG. 4(a) and FIG. 4(b) show schematic diagrams of a NOR-type memory device according to other embodiments of the present disclosure.

According to such embodiments, in a NOR cell array, device layers L1, L2, L3 and L4 may be stacked on a substrate 2001. For example, the device layer L1 may include a first source/drain region $2005_1$, a channel region $2007_1$, and a second source/drain region $2009_1$. The device layer L1 may be a single semiconductor layer in which the first source/drain region $2005_1$, the channel region $2007_1$ and the second source/drain region $2009_1$ are defined by a doping distribution. Alternatively, similar to the above-mentioned embodiments, the device layer L1 may include a stack of source/drain layer, channel layer and source/drain layer. Similarly, the device layer L2 may include a first source/drain region $2005_2$, a channel region $2007_2$, and a second source/drain region $2009_2$. The device layer L3 may include a first source/drain region $2005_3$, a channel region $2007_3$, and a second source/drain region $2009_3$. The device layer L4 may include a first source/drain region $2005_4$, a channel region $2007_4$, and a second source/drain region $2009_4$. The gate stack may extend vertically to pass through the device layers L1, L2, L3 and L4.

As shown in FIG. 4(a), a gate stack (including a memory functional layer) is surrounded by the device layers. The gate stack may cooperate with the device layers to define memory cells, as shown by a dashed circle in FIG. 4(a). The channel region may be connected to the source/drain regions at opposite ends of the channel region, and the channel region may be controlled by the gate stack. In a single memory cell, one of the source/drain regions at upper and lower ends may serve as a source region and may be electrically connected to the source line; and the other may serve as a drain region and may be electrically connected to the bit line. For each two vertically adjacent memory cells, an upper source/drain region of a lower memory cell and a lower source/drain region of an upper memory cell may serve as source regions, so that they may share a same source line connection (referring to dashed circles in FIG. 4(b)).

For further details of the NOR cell array, reference may be made to Chinese patent application 202110252926.x.

Similarly, a peripheral circuit may be flip-chip mounted on the NOR cell array. As for the peripheral circuit, reference may be made to the above descriptions with reference to FIG. 2(a) and FIG. 2(b). The bonding pad PAD1 of the NOR cell array may be bonded with the bonding pad PAD2 of the peripheral circuit. FIG. 4(a) and FIG. 4(b) show that the bonding pad PAD1 and the bonding pad PAD2 are bonded by the bonding component BOND, but they may also be bonded directly to each other as described above.

Figure 5A:
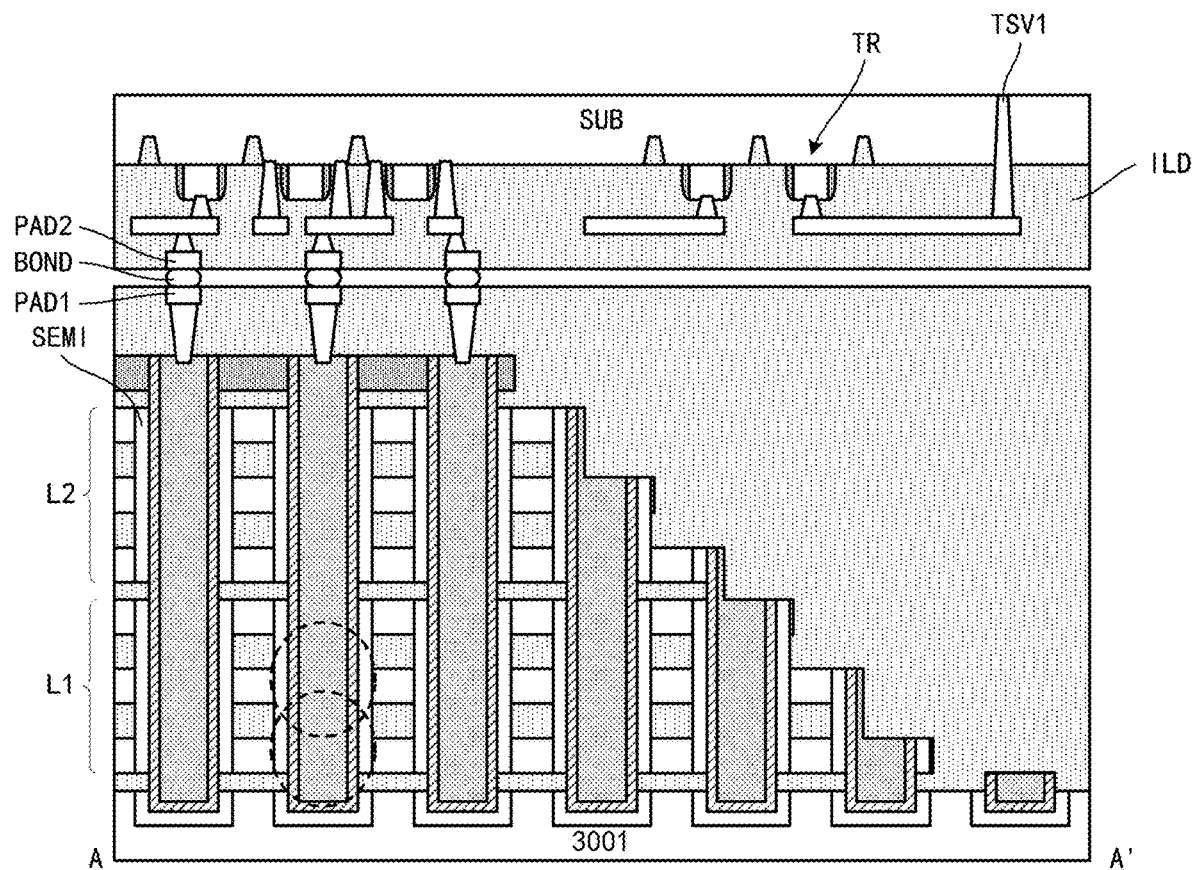
Figure 5B:
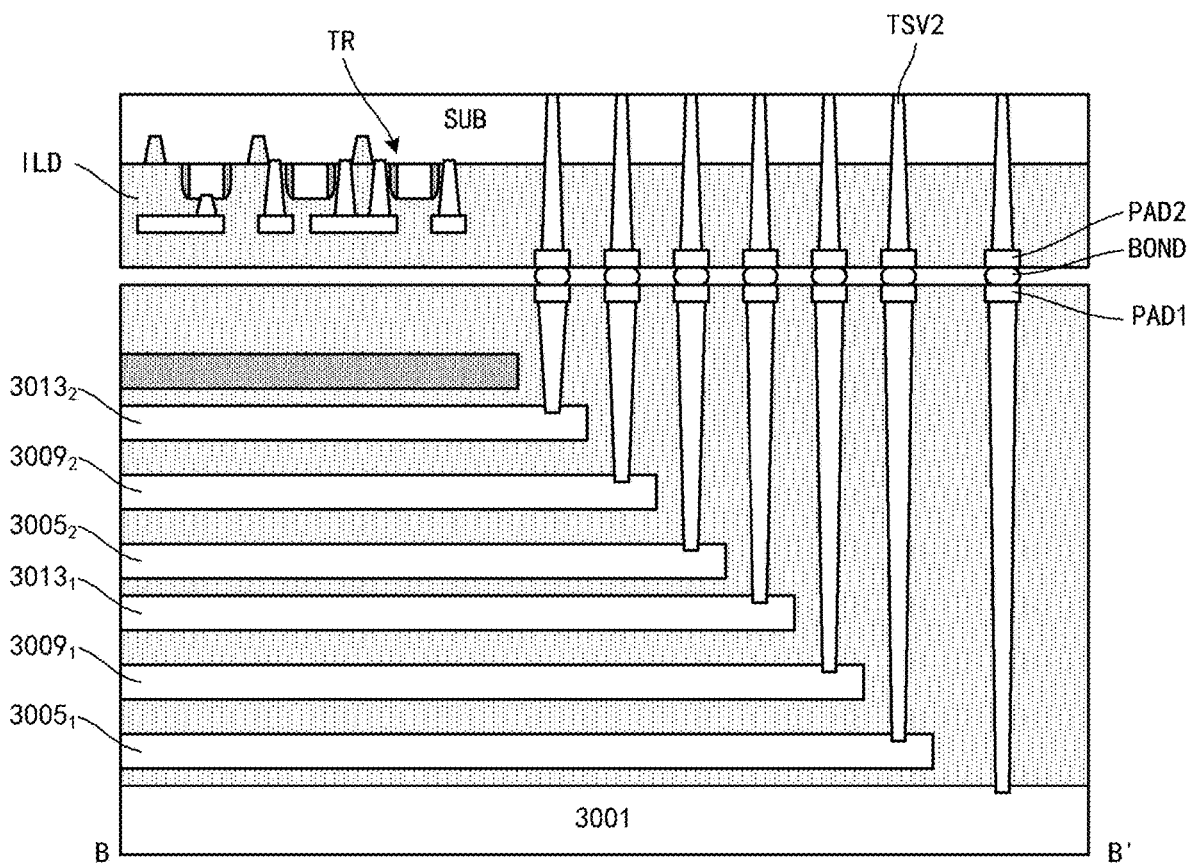

FIG. 5(a) and FIG. 5(b) show schematic diagrams of a NOR-type memory device according to other embodiments of the present disclosure.

According to such embodiments, in a NOR cell array, a gate stack extends vertically on a substrate 3001 to pass through device layers L1 and L2. Both device layers L1 and L2 include a semiconductor layer SEMI extending along a periphery of each gate stack. The semiconducting layer SEMI may be in a form of an annular nanosheet. In the semiconductor layer SEMI, a configuration of source/drain region-channel region-source/drain region-channel region-source/drain region may be defined in the vertical direction by, for example, a doping distribution. In addition, in the device layer L1, a first interconnection layer $3005_1$, a second interconnection layer $3009_1$ and a third interconnection layer $3013_1$ may be provided to surround a periphery of each semiconductor layer SEMI in the device layer L1. Heights of the first interconnection layer $3005_1$, the second interconnection layer $3009_1$ and the third interconnection layer $3013_1$ may correspond to heights of corresponding source/drain regions in the semiconductor layer SEMI. Similarly, in the device layer L2, a first interconnection layer $3005_2$, a second interconnection layer $3009_2$ and a third interconnection layer $3013_2$ may be provided to surround a periphery of each semiconductor layer SEMI in the device layer L2.

As shown in FIG. 5(a), a gate stack (including a memory functional layer) is surrounded by the semiconductor layer SEMI. The gate stack may cooperate with the semiconductor layer SEMI to define memory cells, as shown by dashed circles in FIG. 5(a).

For further details of the NOR cell array, reference may be made to Chinese patent application 202110252871.2.

Similarly, a peripheral circuit may be flip-chip mounted on the NOR cell array. As for the peripheral circuit, reference may be made to the above descriptions with reference to FIG. 2(a) and FIG. 2(b). The bonding pad PAD1 of the NOR cell array may be bonded with the bonding pad PAD2 of the peripheral circuit. FIG. 5(a) and FIG. 5(b) show that the bonding pad PAD1 and the bonding pad PAD2 are bonded by the bonding component BOND, but they may also be bonded directly to each other as described above.

FIG. 6 to FIG. 24(b) show schematic diagrams of some stages in a process of manufacturing a NOR-type memory device according to other embodiments of the present disclosure.

Figure 6:
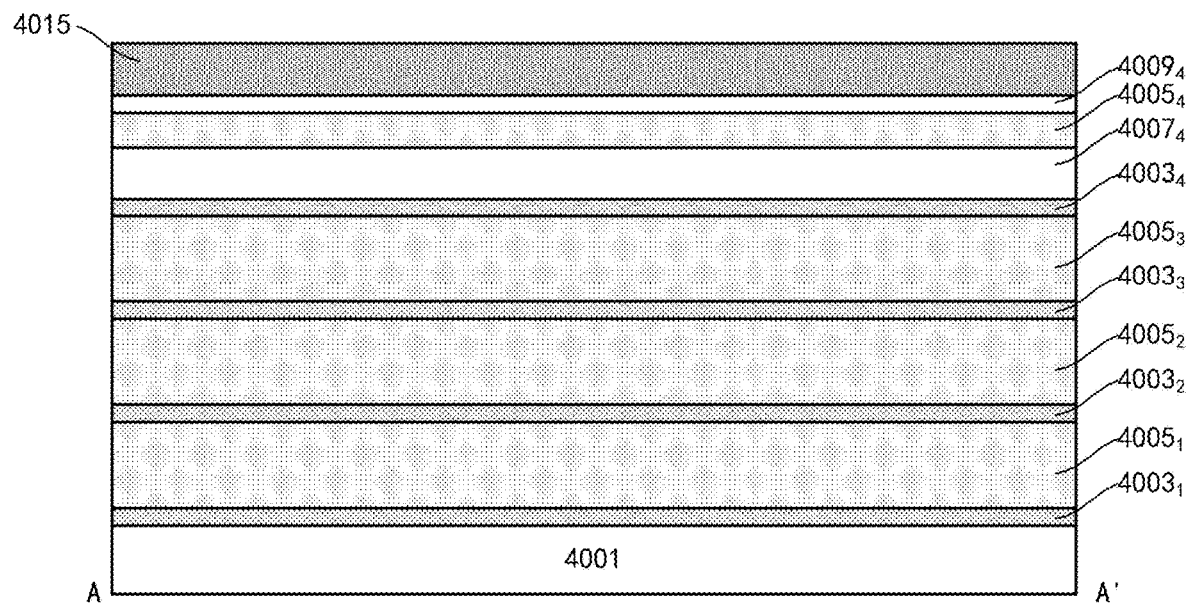

As shown in FIG. 6, a substrate 4001 is provided. The substrate 4001 may be in various forms, including but not limited to a bulk semiconductor material substrate such as a bulk Si substrate, a semiconductor-on-insulator (SOI) substrate, a compound semiconductor substrate such as a SiGe substrate, and the like. In the following descriptions, for convenience of explanation, a bulk Si substrate such as a Si wafer is taken as an example for description.

A memory cell array, such as a NOR-type flash memory cell array, may be formed on the substrate 4001 as follows. A memory cell may be an n-type device or a p-type device. Here, an n-type memory cell is taken as an example for description. For this purpose, a p-type well may be formed in the substrate 4001. Thus, the following description, especially the description of a doping type, is for forming the n-type device. However, the present disclosure is not limited to this.

A sacrificial layer $4003_1$ for defining an isolation layer and a memory device layer $4005_1$ for defining an active region of the memory cell may be formed on the substrate $400_1$, for example, by an epitaxial growth.

Each layer grown on the substrate 4001 may be a monocrystalline semiconductor layer. Because these layers are grown or doped separately, a crystal interface or a doping concentration interface may exist between these layers.

The sacrificial layer $4003_1$ may be subsequently replaced by an isolation layer for isolating a device from the substrate, and a thickness of the sacrificial layer may correspond to a desired thickness of the isolation layer, for example, in a range of about 10 nm to 50 nm. According to a circuit design, the sacrificial layer $4003_1$ may be omitted. The memory device layer $4005_1$ may subsequently define the active region of the memory cell, and may have a thickness of about 40 nm to 200 nm.

These semiconductor layers may contain various suitable semiconductor materials, for example, an elemental semiconductor material such as Si or Ge, or a compound semiconductor material such as SiGe, and the like. Considering the following processes for replacing the sacrificial layer $4003_1$ by an isolation layer, the sacrificial layer $4003_1$ may have an etching selectivity with respect to the memory device layer $4005_1$. For example, the sacrificial layer $4003_1$ may contain SiGe (in which an atomic percentage of Ge is about 15% to 30%, for example), and the memory device layer $4005_1$ may contain Si.

The memory device layer $4005_1$ may be doped in situ when growing. For example, for an n-type device, a p-type doping may be performed, and a doping concentration may be, for example, about $1E17$ $cm^{-3}$ to $1E19$ $cm^{-3}$. Such doping may define a doping characteristic in the channel region formed subsequently, so as to, for example, adjust a device threshold voltage ($V_t$), control a short channel effect, and the like. Here, the doping concentration may have a non-uniform distribution in the vertical direction, so as to optimize the device performance. For example, the concentration is relatively high in a region close to the drain region (which is then connected to the bit line) to reduce the short channel effect, while the concentration is relatively low in a region close to the source region (which is then connected to the source line) to reduce the channel resistance. This may be achieved by introducing different doses of the dopant in different stages of growth.

A plurality of memory device layers may be provided in order to increase an integration density. For example, memory device layers $4005_2$ and $4005_3$ may be provided on the memory device layer $4005_1$ by an epitaxial growth, and the memory device layers may be separated from each other by sacrificial layers $4003_2$ and $4003_3$ for defining isolation layers. Only three memory device layers are shown in FIG. 6, but the present disclosure is not limited thereto. According to the circuit design, it is possible to omit the isolation layer between certain memory device layers. The memory device layers $4005_2$ and $4005_3$ may have the same or similar thickness and/or material as the memory device layer $4005_1$, or may have different thicknesses and/or materials from the memory device layer $4005_1$. Here, for convenience of descriptions, it is assumed that each memory device layer has the same configuration.

A selection device layer for defining an active region of the selection transistor may be provided on the memory device layer. For example, a first source/drain layer $4007_4$, a channel layer $4005_4$ and a second source/drain layer $4009_4$ may be formed in sequence by an epitaxial growth as the selection device layer. These grown layers may be monocrystalline semiconductor layers.

The first source/drain layer $4007_4$ may then define a (lower) source/drain region of the selection transistor, and may have a thickness in a range of, for example, about 30 nm to 200 nm. The channel layer $4005_4$ may then define a channel region of the selection transistor, and may have a thickness in a range of, for example, about 30 nm to 100 nm. The second source/drain layer $4009_4$ may then define an (upper) source/drain region of the selection transistor, and may have a thickness in a range of, for example, about 10 nm to 100 nm. Here, the first source/drain layer $4007_4$ is relatively thick, which may facilitate a fabrication of a gate stack connecting portion for selection transistor and memory cell in subsequent processes.

The first source/drain layer $4007_4$ and the second source/drain layer $4009_4$ may be doped in situ when growing. For example, for an n-type device, an n-type doping may be performed, and a doping concentration may be, for example, about $1E19$ $cm^{-3}$ to $1E21$ $cm^{-3}$. Such doping may define a doping characteristic in the source/drain region of the selection transistor. Similarly, the channel layer $4005_4$ may be doped in situ when growing. For example, for an n-type device, a p-type doping may be performed, and a doping concentration may be, for example, about $1E17$ $cm^{-3}$ to $1E19$ $cm^{-3}$. Such doping may define a doping characteristic in the channel region formed subsequently, so as to, for example, adjust $V_t$ of the device, control the short channel effect, and the like.

A sacrificial layer $4003_4$ for defining an isolation layer may be further provided between the selection device layer and the memory device layer $4005_3$. As for the sacrificial layers $4003_2$ to $4003_4$, reference may be made to the above descriptions for the sacrificial layer $4003_1$.

As described above, considering the following processes for replacing the sacrificial layer by an isolation layer, the selection device layer may have an etching selectivity with respect to the sacrificial layer $4003_4$ (and sacrificial layers $4003_1$ to $4003_3$, which may contain the same material such as SiGe). For example, the first source/drain layer $4007_4$, the channel layer $4005_4$ and the second source/drain layer $4009_4$ may contain Si. Here, each layer in the selection device layer contains the same material, so that the active region of the selection transistor may be defined by a same etching step in the subsequent processes. However, the present disclosure is not limited thereto. Adjacent layers in the selection device layer may also have etching selectivity with respect to each other.

In such embodiments, the memory device layers $4005_1$, $4005_2$ and $4005_3$ may be formed by a single epitaxial layer, and source/drain regions may be then defined therein by diffusion doping, which will be further described below. However, the present disclosure is not limited thereto. For example, at least one of the memory device layers $4005_1$, $4005_2$ and $4005_3$ may be formed in a form of the selection device layer, including a first source/drain layer, a channel layer and a second source/drain layer that are stacked in sequence. In this case, the following processes may also be performed, but the diffusion doping process may not be performed (certainly, the diffusion doping process may also be performed, for example, to adjust doping characteristics of the source/drain regions).

In addition, in such embodiments, the selection device layer includes portions $4007_4$, $4005_4$ and $4009_4$ that are doped in situ to different doping characteristics during the epitaxial growth. However, the present disclosure is not limited thereto. For example, the selection device layer may be formed by a single epitaxial layer, like the memory device layers $4005_1$, $4005_2$ and $4005_3$, and the source/drain regions may be then defined therein by diffusion doping.

For convenience of patterning, a hard mask layer 4015 may be provided on these layers formed on the substrate 4001. For example, the hard mask layer 4015 may contain a nitride (e.g., silicon nitride) and may have a thickness in a range of about 100 nm to 300 nm.

In the following, on one hand, a processing channel that may reach the sacrificial layer is required, so that the sacrificial layer may be replaced by an isolation layer; and on the other hand, it is required to define a region for forming a gate. According to the embodiments of the present disclosure, the two aspects may be performed in combination. Specifically, a gate region may be defined by using the processing channel.

Figure 7A:
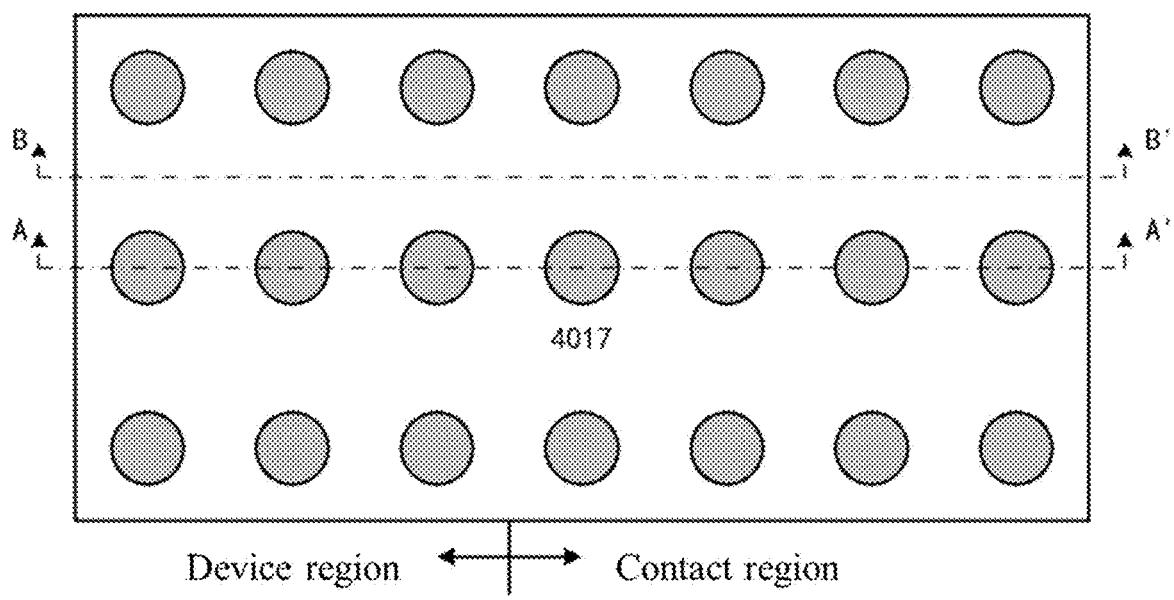
FIGS. 7(a), 12(a), 13(a), 18(a), 22(a) and 23(a) are top views, the positions of line AA' and line BB' are shown in FIG. 7(a), FIGS. 6, 7(b), 8 to 11, 12(b), 13(b), 14 to 17, 18(b), 19(a), 20(a), 21(a), 22(b), 23(b) and 24(a) are cross-sectional views taken along line AA'.
Figure 7B:
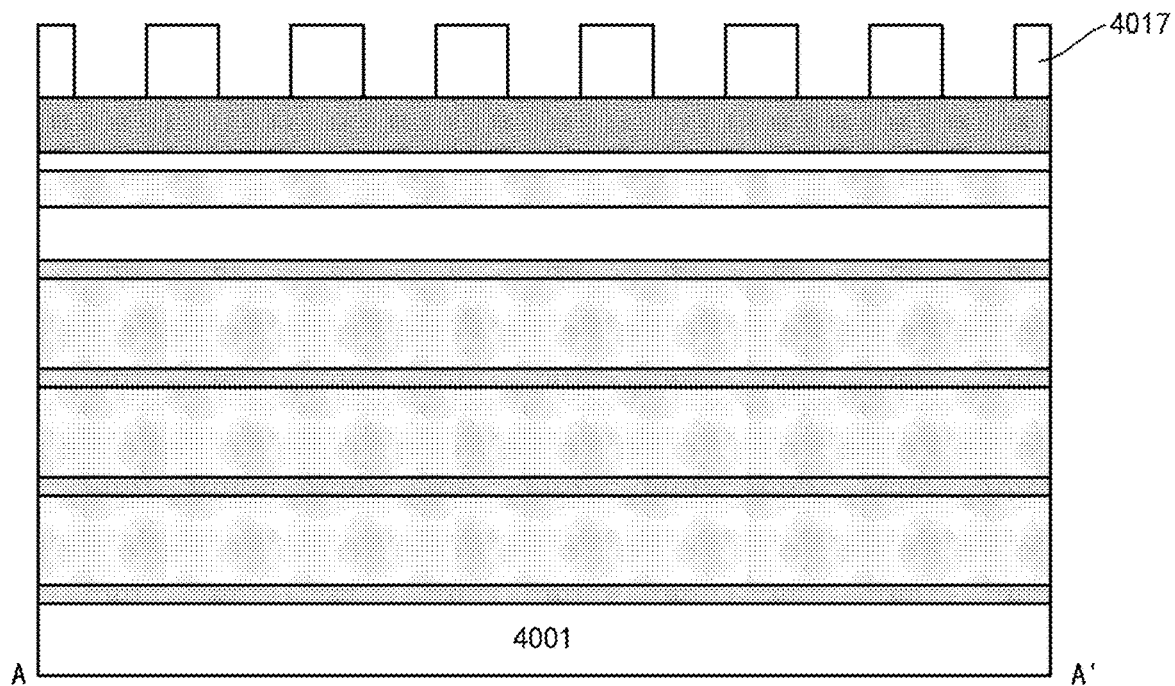

For example, as shown in FIG. 7(a) and FIG. 7(b), a photoresist 4017 may be formed on the hard mask layer 4015 and may be patterned by photolithography to have a plurality of openings, and these openings may define positions of processing channels. The opening may have various suitable shapes, such as circle, rectangle, square, polygon, etc. and may have a suitable size, such as a diameter or a side length in a range of about 20 nm to 500 nm. Here, these openings (especially in the device region) may be arranged in a form of an array, for example, a two-dimensional array in a horizontal direction and a vertical direction in paper in FIG. 7(a). The array may then define an array of memory cells. FIG. 7(a) shows openings formed on the substrate (including a device region for subsequently fabricating memory cells and a contact region for subsequently fabricating contact portions) with a substantially uniform size and a substantially uniform density, but the present disclosure is not limited thereto. The size and/or density of the openings may be changed. For example, a density of openings in the contact region may be less than a density of openings in the device region, so as to reduce a resistance in the contact region.

Figure 8:
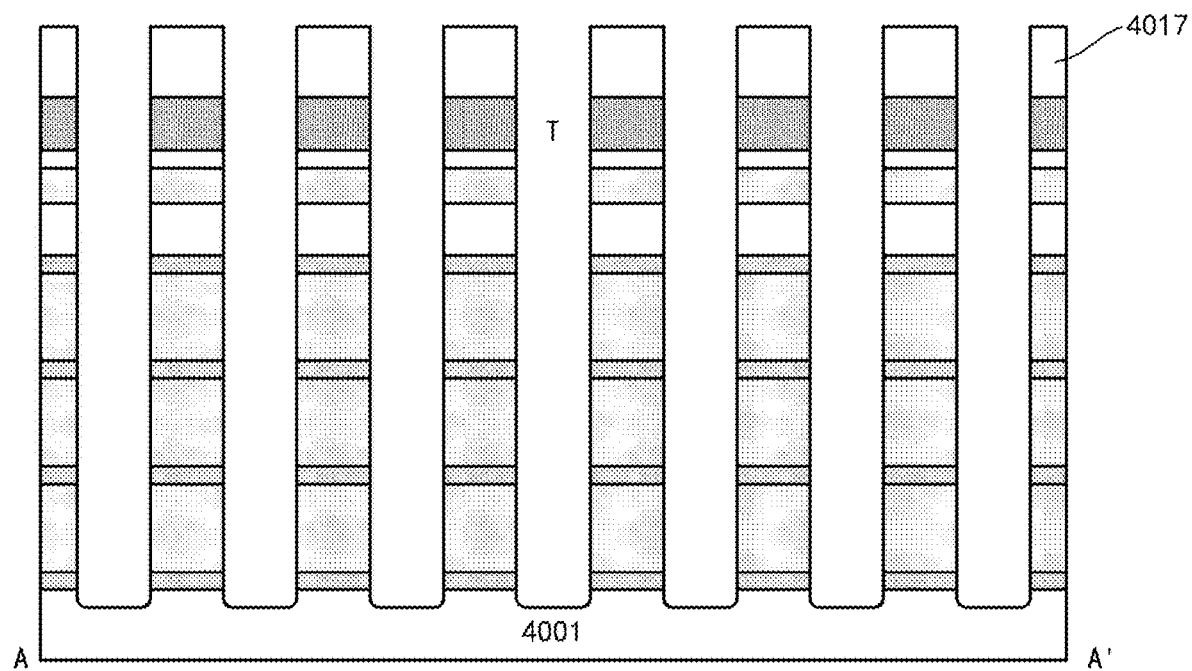

As shown in FIG. 8, the layers on the substrate 4001 may be etched, using the photoresist 4017 patterned in such manner as an etching mask, by an anisotropic etching such as Reactive Ion Etching (RIE), so as to form a processing channel T. The RIE may be performed in a substantially vertical direction (e.g., a direction perpendicular to the substrate surface) and may be performed into the substrate

4001. Accordingly, a plurality of vertical processing channels T may be formed on the substrate 4001. The processing channels T in the device region may further define a gate region. After that, the photoresist 4017 may be removed.

Then, a sidewall of the sacrificial layer is exposed in the processing channel T. The sacrificial layer may be then replaced by an isolation layer via the exposed sidewall. Considering a function of supporting the memory device layers $4005_1$ to $4005_3$ and the selection device layer during replacement, a support layer may be formed.

Figure 9:
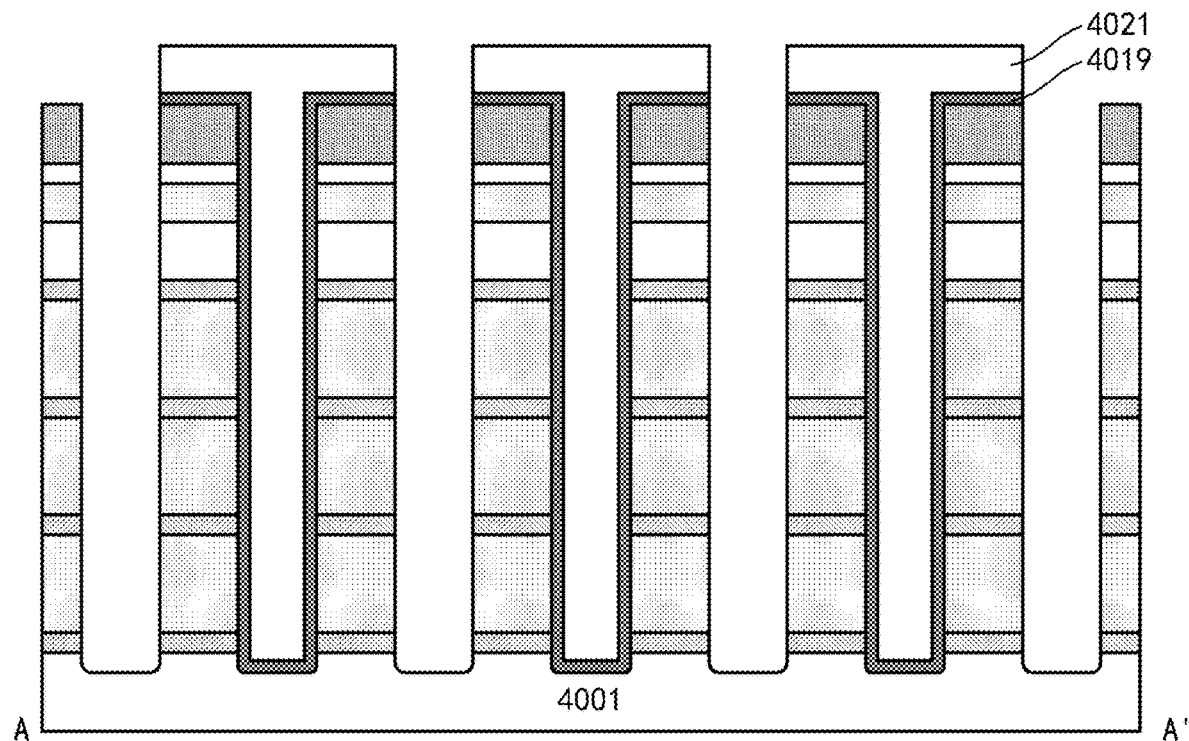

For example, as shown in FIG. 9, a support material layer may be formed on the substrate 4001, for example, by a deposition such as Chemical Vapor Deposition (CVD). The support material layer may be formed in a substantially conformal manner. Considering the etching selectivity, especially the etching selectivity with respect to the hard mask layer 4015 (a nitride in this example) and the subsequently formed isolation layer (an oxide in this example), the support material layer may contain, for example, SiC. For example, by forming a photoresist 4021 and performing a selective etching such as RIE with the photoresist 4021, a part of the support material layer in one or more of processing channels T may be removed while a part of the support material layer in the rest of processing channels T may be retained. The remaining part of the support material layer may form a support layer 4019. In this way, on one hand, the sacrificial layer may be replaced through the processing channels in which the support layer 4019 is not formed, and on the other hand, the memory device layers $4005_1$ to $4005_3$ and the selection device layer may be supported by the support layer 4019 in the rest of processing channels. After that, the photoresist 4021 may be removed.

An arrangement of the processing channels in which the support layer 4019 is formed and the processing channels in which the support layer 4019 is not formed may be achieved by a pattern of the photoresist 4021. In addition, the processing channels in which the support layer 4019 is formed and the processing channels in which the support layer 4019 is not formed may be substantially evenly distributed for process consistency and uniformity. As shown in FIG. 9, the processing channels in which the support layer 4019 is formed and the processing channels in which the support layer 4019 is not formed may be arranged alternately.

Figure 10:
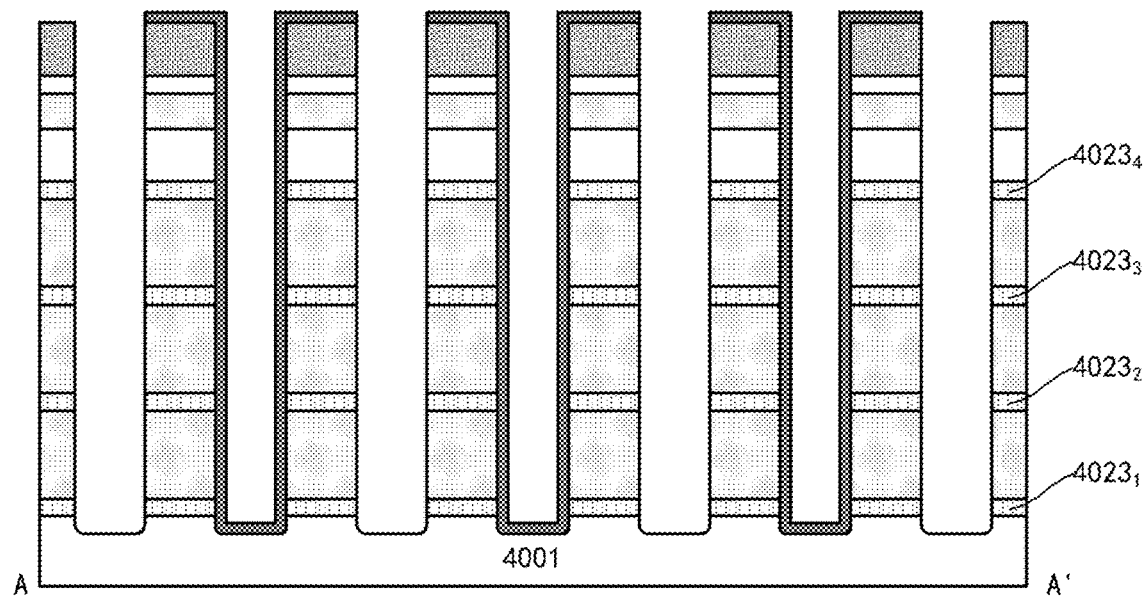

Then, as shown in FIG. 10, the sacrificial layers $4003_1$ to $4003_4$ may be removed by a selective etching via the processing channel T. Due to an existence of the support layer 4019, the memory device layers $4005_1$ to $4005_3$ and the selection device layer may be kept from collapsing. Gaps formed by the removal of the sacrificial layers may be filled with a dielectric material by, for example, a process of depositing (preferable ALD to better control a film thickness) and then etching back (e.g., RIE in the vertical direction), so as to form isolation layers $4023_1$, $4023_2$, $4023_3$ and $4023_4$.

According to the embodiments of the present disclosure, in order to achieve the source/drain doping, the isolation layers $4023_1$ to $4023_4$ may contain a dopant (an n-type dopant for an n-type memory cell and a p-type dopant for a p-type memory cell). Accordingly, the isolation layers $4023_1$ to $4023_4$ may be solid phase dopant source layers. For example, the isolation layers $4023_1$ to $4023_4$ may contain phosphosilicate glass (PSG) having a phosphorus (P) content of about 0.1% to 10% (for an n-type memory cell) or borosilicate glass (BSG) having a boron (B) content of about 0.1% to 10% (for a p-type memory cell).

In this example, the source/drain doping is achieved by the solid phase dopant source layer instead of in-situ doping, so that a steep high source/drain doping may be achieved, and a possible cross contamination caused by in-situ growth during epitaxial growth may be inhibited.

After that, the support layer 4019 may be removed by a selective etching.

A gate stack of the memory cell may be formed in the processing channel, especially in the processing channel in the device region. Here, in order to form a memory device, a memory function may be achieved by the gate stack. For example, the gate stack may include a memory structure, such as a charge trapping material or a ferroelectric material.

Figure 11:
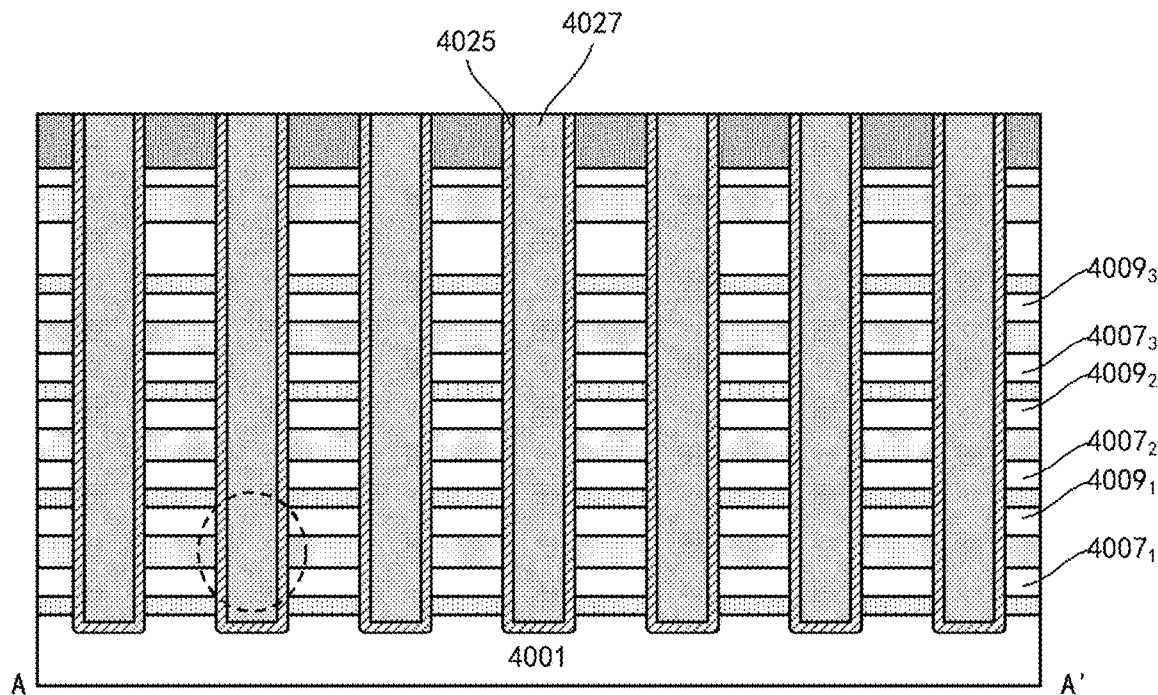

As shown in FIG. 11, a memory functional layer 4025 and a gate conductor layer 4027 may be formed in sequence, for example, by a deposition. The memory functional layer 4025 may be formed in a substantially conformal manner, and a gap left in the processing channel T after the memory functional layer 4025 is formed may be filled with the gate conductor layer 4027. A planarization process such as chemical mechanical polishing (CMP) may be performed on the gate conductor layer 4027 and the memory functional layer 4025 (the CMP may stop at the hard mask layer 4015, for example), so that the gate conductor layer 4027 and the memory functional layer 4025 may be left in the processing channel T to form a gate stack.

The memory functional layer 4025 may be based on a dielectric charge trapping, a ferroelectric material effect, or a bandgap engineering charge memory (SONOS), etc. For example, the memory functional layer 4025 may include a dielectric tunneling layer (e.g., an oxide with a thickness in a range of about 1 nm to 5 nm, which may be formed by an oxidation or ALD), a band-offset layer (e.g., a nitride with a thickness in a range of about 2 nm to 10 nm, which may be formed by CVD or ALD), and an isolation layer (e.g., an oxide with a thickness in a range of about 2 nm to 6 nm, which may be formed by an oxidation, CVD or ALD). Such a three-layer structure may result in a band structure that may trap electrons or holes. Alternatively, the memory functional layer 4025 may include a ferroelectric material layer, such as $HfZrO_2$ with a thickness in a range of about 2 nm to 20 nm.

The gate conductor layer 4027 may contain, for example, a (doped, e.g., p-type doped in a case of an n-type device) polycrystalline silicon or a metal gate material.

An annealing process may be performed to drive the dopant in the solid phase dopant source layer into the memory device layer. For each of the memory device layers $4005_1$ to $4005_3$, the dopant in the isolation layers at upper and lower ends of the memory device layer may enter the memory device layer from the upper and lower ends respectively, so that highly doped regions $4007_1$, $4009_1$; $4007_2$, $4009_2$; $4007_3$, $4009_3$ may be formed at the upper and lower ends (e.g., n-type doping in a range of about $1E19$ $cm^{-3}$ to $1E21$ $cm^{-3}$), so as to define the source/drain regions. A diffusion depth of the dopant from the isolation layer to the memory device layer may be controlled (e.g., to be in a range of about 10 nm to 50 nm), so that a relatively low doping may be kept in the middle of each memory device layer in the vertical direction, for example, a doping polarity (e.g., a p-type doping) and a doping concentration (e.g., in a range of $1E17$ $cm^{-3}$ to $1E19$ $cm^{-3}$) caused by the in-situ doping during growth may be substantially kept, and the channel region may be defined. Certainly, the dopant in the isolation layer $4023_4$ may also enter into the selection device layer, especially the first source/drain layer $4007_4$ in the selection device layer.

The doping concentration achieved by the in-situ doping is generally less than $1E20$ $cm^{-3}$. According to the embodiments of the present disclosure, the source/drain doping is performed by the diffusion from the solid phase dopant source layer, which may achieve a high doping. For example, a maximum doping concentration may be greater than 1E20 cm$^{-3}$, even up to a range of about 7E20 cm$^{-3}$ to 3E21 cm$^{-3}$. Moreover, due to the diffusion characteristic, the source/drain region may have a doping concentration gradient that decreases from a side of the source/drain region close to the solid phase dopant source layer to a side of the source/drain region close to the channel region in the vertical direction.

Such diffusion doping may achieve a steep doping concentration distribution. For example, there may be a sharp change in doping concentration between the source/drain region and the channel region, e.g. less than about 5 nm/dec to 20 nm/dec (that is, a decrease of the doping concentration by at least one order of magnitude occurs in a range of less than about 5 nm to 20 mm). The region having such sharp change in the vertical direction may be called an "interface layer".

Since the diffusion from the isolation layer into the memory device layer has substantially the same diffusion characteristic, each of the source/drain regions $4007_1$, $4009_1$; $4007_2$, $4009_2$; $4007_3$, $4009_3$ may be substantially coplanar in a transverse direction. Similarly, each channel region may be substantially coplanar in the transverse direction. In addition, as described above, the channel region may have a non-uniform distribution in the vertical direction. The doping concentration in a region of the channel region close to the source/drain region (drain region) on one side of the channel region is relatively high, while the doping concentration in a region of the channel region close to the source/drain region (source region) on the other side of the channel region is relatively low.

As shown in FIG. 11, the gate stack (4025/4027) including the memory functional layer is surrounded by the memory device layers. The gate stack is cooperated with the device layers to define the memory cell, as shown by dashed circles in FIG. 11. The channel region may be connected to the source/drain regions at opposite sides of the channel region, and the channel region may be controlled by the gate stack. In a single memory cell, one of the source/drain regions at upper and lower ends may serve as the source region and may be electrically connected to the source line; and the other may serve as the drain region and may be electrically connected to the bit line. For each two adjacent memory cells in the vertical direction, a source/drain region at an upper end of the lower one of the two memory cells and a source/drain region at a lower end of the upper one of the two memory cells may be used as source regions, and thus may share the same source line connection.

The gate stack may extend in a column shape in the vertical direction and overlap with a plurality of (which is three in this example) memory device layers, so as to define a plurality of memory cells stacked on each other in the vertical direction. The memory cells associated with a single gate stack column may form a memory cell string. Corresponding to an arrangement of gate stack columns (corresponding to the arrangement of processing channels T described above, e.g., a two-dimensional array), a plurality of such memory cell strings are arranged on the substrate, so as to form a three-dimensional (3D) array of memory cells.

At an upper end of each memory cell string (in the device region), a selection transistor may be fabricated based on the selection device layer.

According to the embodiments of the present disclosure, the selection transistor may be formed based on the processing channel T. For example, a gate stack of the selection transistor may be formed in the processing channel T, and an active region of the selection transistor surrounds the gate stack, similar to the memory cell. In this way, the resulting selection transistor may be self-aligned to the memory cell string located below.

The active regions of the selection transistors of the memory cell strings may be electrically isolated from each other, so as to achieve an independent selection of each memory cell string. To this end, the selection device layer may be separated into localized portions surrounding the corresponding processing channels T, which serve as the active regions of the selection transistors.

Figure 12A:
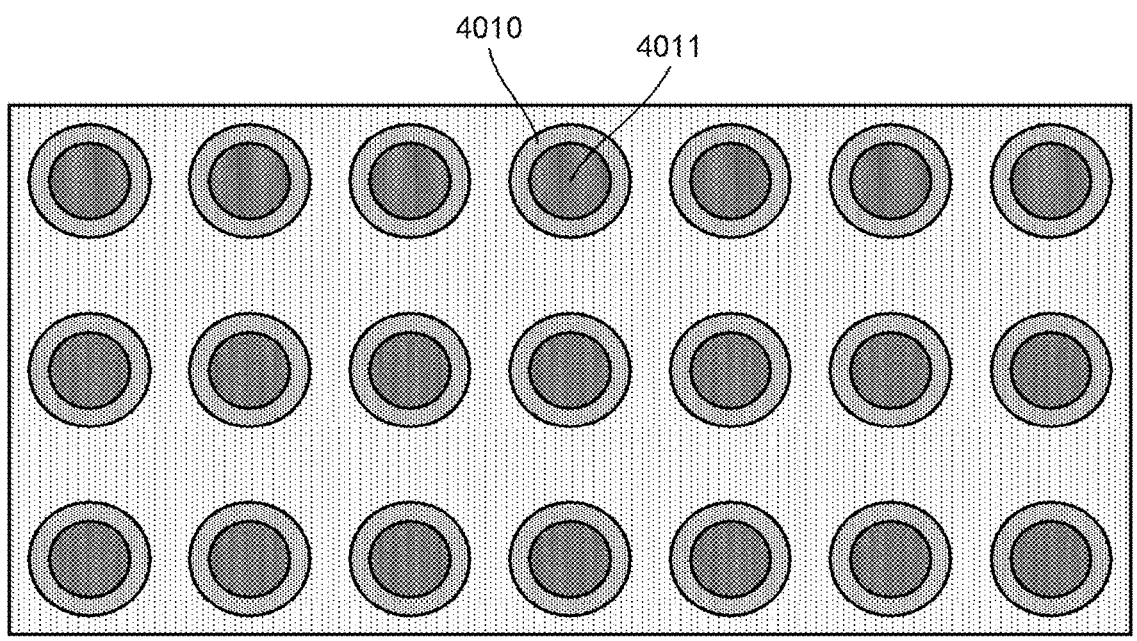
Figure 12B:
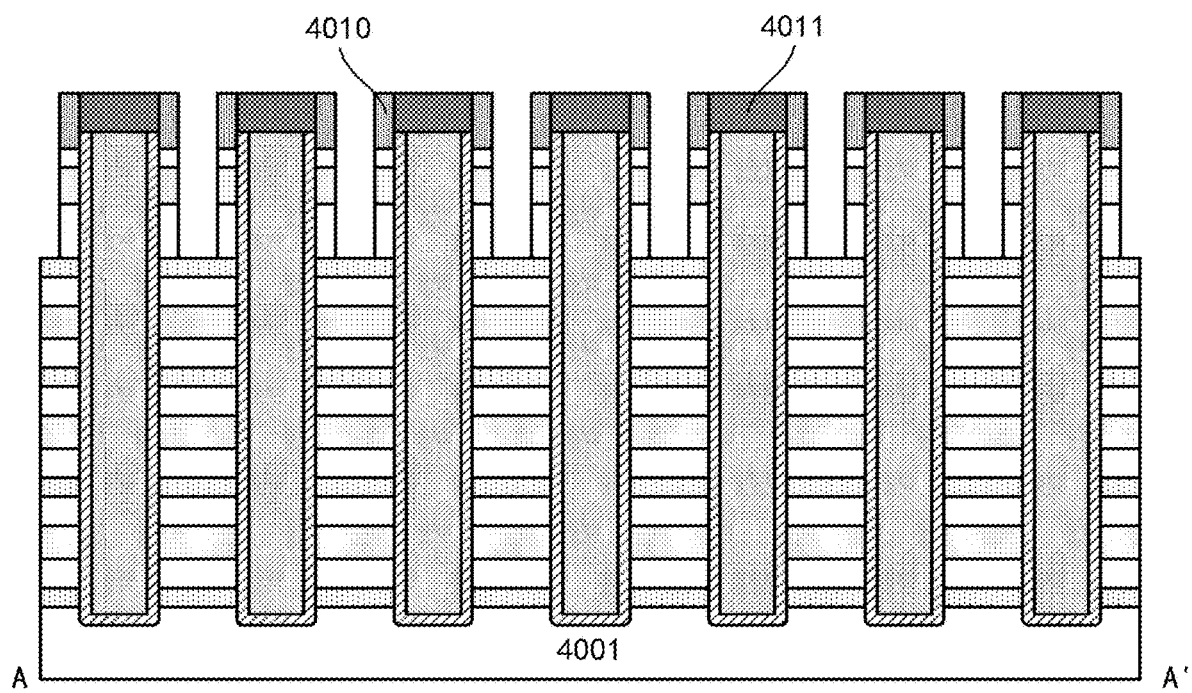

In order to better provide a position reference when localizing the selection device layer and avoid affecting the gate stack (4025/4027) of the memory cell (for example, especially in a case that the gate conductor layer 4027 contains polycrystalline silicon), as shown in FIG. 12(*a*) and FIG. 12(*b*), the gate stack (4025/4027) of the memory cell may be etched back by a certain thickness by an anisotropic etching such as RIE in the vertical direction. A space left by the etching back in the processing channel T may be filled with a cap layer 4011 by a method of, for example, deposition followed by planarization (e.g., CMP, which may stop at the hard mask layer 4015). The cap layer 4011 may contain, for example, SiC, in consideration of the etching selectivity (for example, the etching selectivity with respect to the hard mask layer 4015 such as nitride and the isolation layer such as oxide). Here, a bottom surface of the cap layer 4011 may be higher than a bottom surface of the hard mask layer 4015, so that the cap layer 4011 may be limited in a processing channel portion defined by the hard mask layer 4015, and may be self-aligned to the gate stack of the memory cell located below. The cap layer 4011 formed in this manner may be used as a position reference of the active region of the selection transistor.

A mask that includes separate portions respectively surrounding the processing channels T may be formed to define the active regions of the selection transistors. Here, a self-aligned mask may be formed by a spacer forming process.

For example, the hard mask layer 4015 may be removed by a selective etching. Accordingly, the cap layer 4011 presents in form of island shape that is protruded with respect to the selection device layer and self-aligned to the gate stack of the memory cell. A spacer 4010 may be formed on a sidewall of such a protruding island-shaped portion as a mask. For example, a layer of dielectric such as a nitride (to have etching selectivity with respect to the cap layer 4011 and the isolation layer) may be deposited in a substantially conformal manner, and then an anisotropic etching such as RIE in the vertical direction may be performed on the deposited dielectric to remove a transverse extending portion of the deposited dielectric and remain a vertical extending portion of the deposited dielectric, thereby forming the spacer 4010. A thickness (a dimension in the horizontal direction in the figures) of the spacer 4010 may define a size of the active region of the selection transistor and may be, for example, in a range of about 5 nm to 20 nm.

An anisotropic etching such as RIE in the vertical direction may be performed on the selection device layer by using the spacer 4010 as an etching mask. The RIE may stop at the isolation layer $4023_4$. Accordingly, the selection device layer (the first source/drain layer $4007_4$, the channel layer $4005_4$ and the second source/drain layer $4009_4$) may be separated into localized portions respectively surrounding the processing channels T. These localized portions may define the active regions of the selection transistors corresponding to the memory cell strings.

A lower source/drain region of the selection transistor may be electrically connected to the gate stack of the corresponding memory cell string (which will be further described below), and an upper source/drain region of the selection transistor may be electrically connected to a word line. Accordingly, a gate control voltage applied on each word line may be applied to the gate stack of the corresponding memory cell string via the corresponding selection transistor.

Figure 13A:
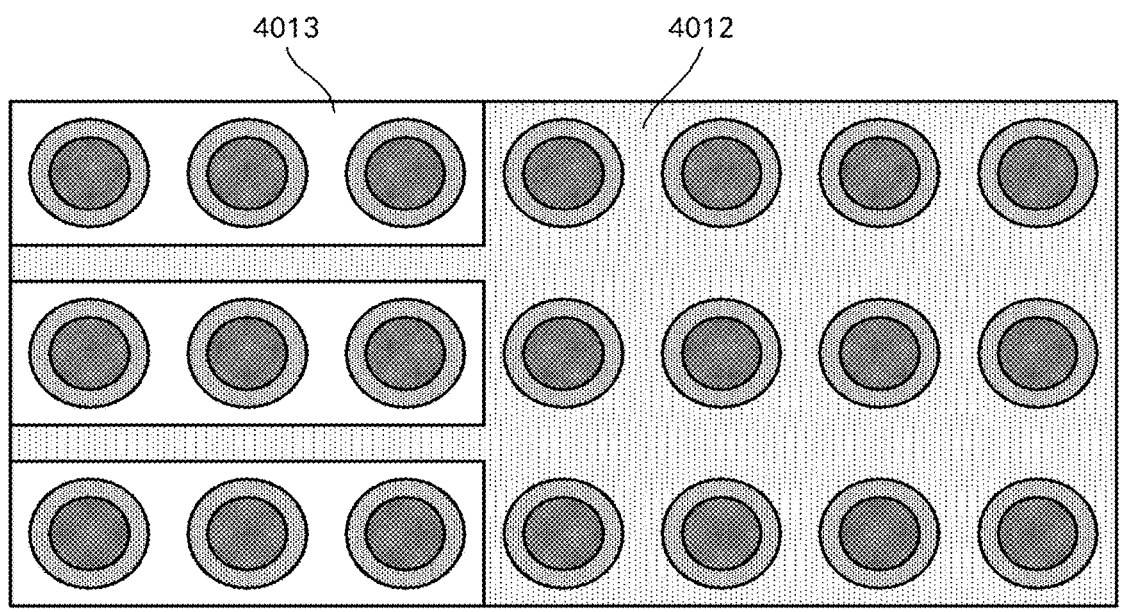
Figure 13B:
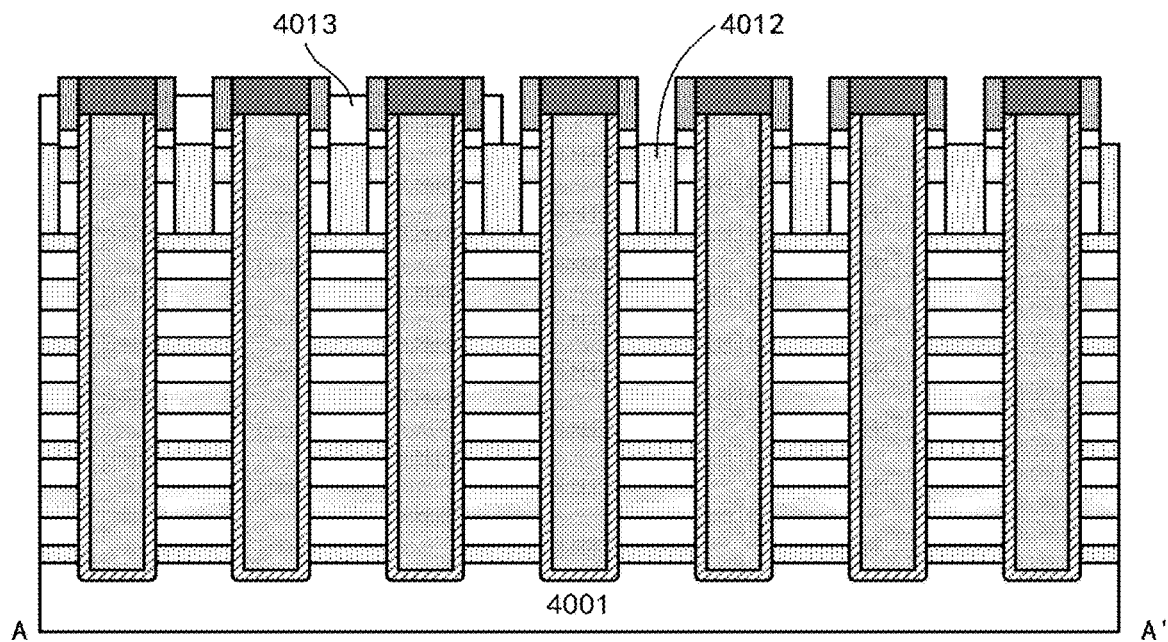

Here, a word line electrically connected to the upper source/drain region of the selection transistor may be fabricated. For example, as shown in FIG. 13($a$) and FIG. 13($b$), an isolation layer 4012 may be formed on the isolation layer $4023_4$. The isolation layer 4012 may be formed by depositing, for example, an oxide, then performing a planarization such as CMP on the deposited oxide (the CMP may stop at the cap layer 4011), and then etching back the planarized oxide. The isolation layer 4012 may shield the first source/drain layer $4007_4$ and the channel layer $4005_4$, while exposing at least a part of the second source/drain layer $4009_4$, so that the word line subsequently formed thereon may be electrically connected to the second source/drain layer $4009_4$ and electrically isolated from the first source/drain layer $4007_4$ and the channel layer $4005_4$. A word line 4013 may be formed on the isolation layer 4012. The word line 4013 may contain a conductive material such as metal, and may be formed by, for example, deposition followed by etching, or a dual damascene process, or the like. The word line 4013 may be in contact with and thus electrically connected to an exposed portion of the second source/drain layer $4009_4$. According to the embodiments, before the formation of the word line 4013, a silicidation process may be performed on the exposed portion of the second source/drain layer $4009_4$ to form a silicide, so as to reduce a contact resistance between the second source/drain layer $4009_4$ and the word line 4013.

As shown in the top view in FIG. 13($a$), a plurality of word lines 4013 may be formed as strips extending in a first direction (a horizontal direction on the paper plane in FIG. 13($a$)), and arranged in a second direction (a vertical direction on the paper plane in FIG. 13($a$)) intersecting (e.g., perpendicular to) the first direction. Here, the word lines 4013 may be formed in the device region without extending into the contact region, so as to avoid mutual interference with contact portions subsequently formed in the contact region.

Figure 14:
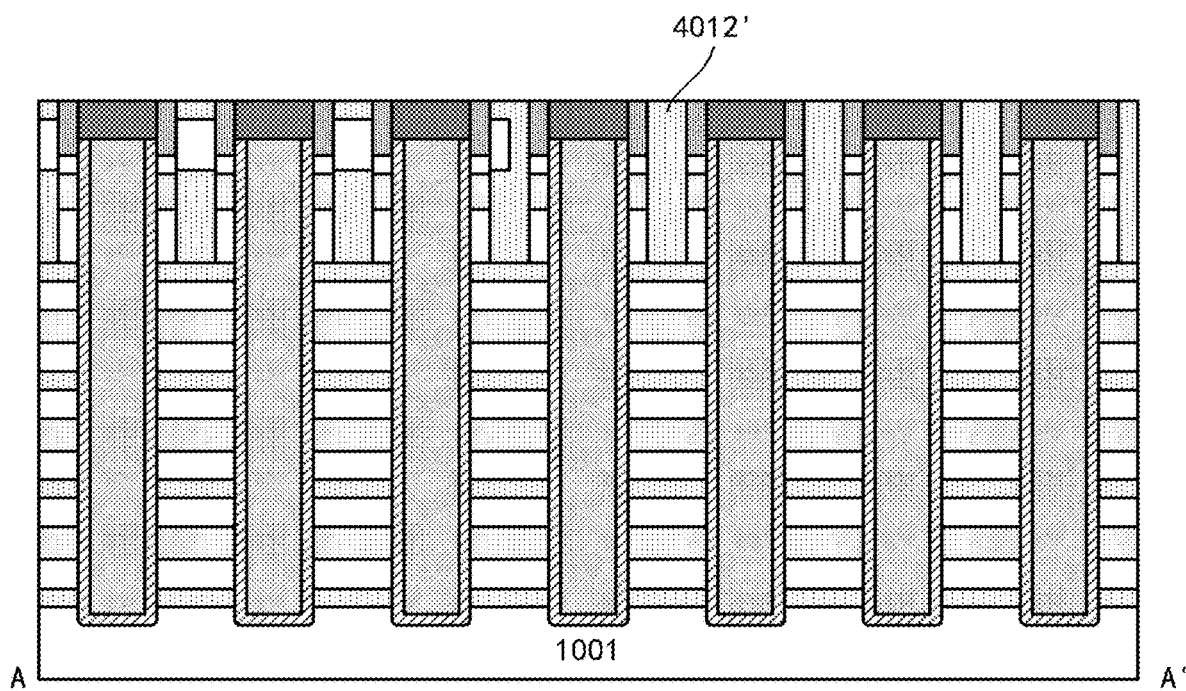

As shown in FIG. 14, a gap in a current structure may be filled with a dielectric to facilitate further processing. Such filling may be performed by, for example, deposition followed by planarization. The filled dielectric may contain a material identical to a material of the isolation layer 4012, such as an oxide, and thus, they are shown as integral and denoted by 4012' in FIG. 14.

The gate stack of the selection transistor may be formed in the processing channel T at a height corresponding to the selection device layer (especially the channel layer $4005_4$ therein).

Figure 15:
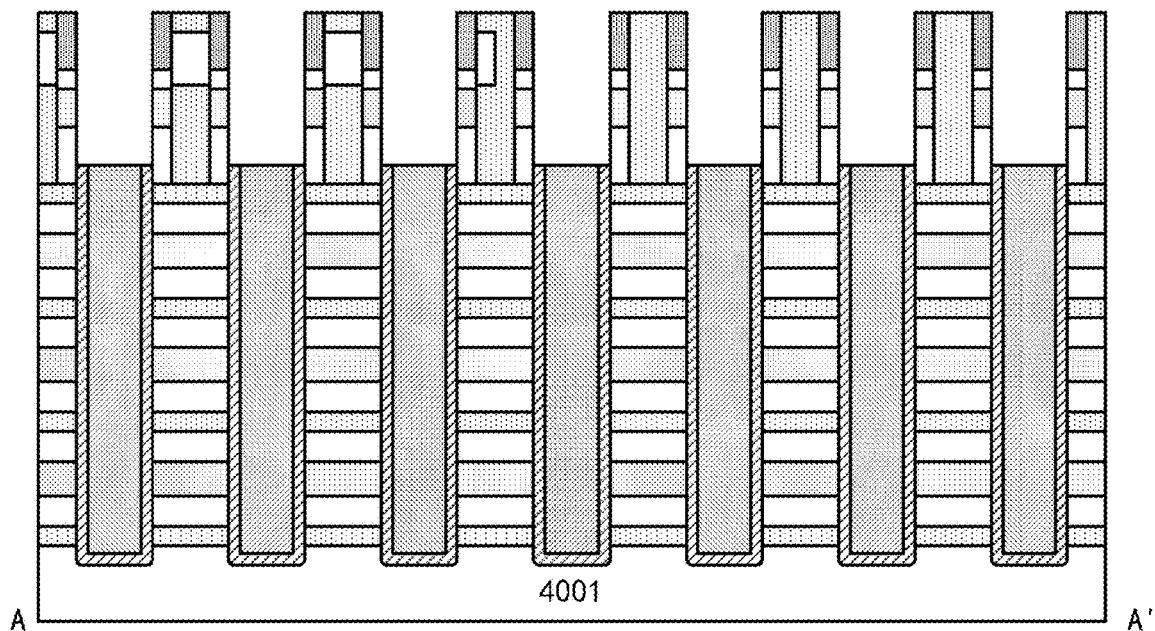

For example, as shown in FIG. 15, the cap layer 4011 may be removed by a selective etching to expose the gate stack of the memory cell. The gate stack of the memory cell may be recessed to a certain depth by a selective etching. Here, on one hand, a top surface of the recessed gate stack of the memory cell may be lower than a bottom surface of the channel layer $4005_4$, so that the gate stack of the selection transistor formed subsequently may overlap with an entire height of the channel layer $4005_4$; on the other hand, the top surface of the recessed gate stack of the memory cell may be higher than a top surface of an uppermost memory device layer (preferably higher than the top surface of the uppermost isolation layer $4023_4$), so as to avoid an undesired electrical connection between the uppermost memory device layer and a subsequently formed gate stack connecting portion for selection transistor and memory cell.

In this way, an upper space of each processing channel T is released. The gate stacks of the selection transistors may be formed in these released spaces.

Figure 16:
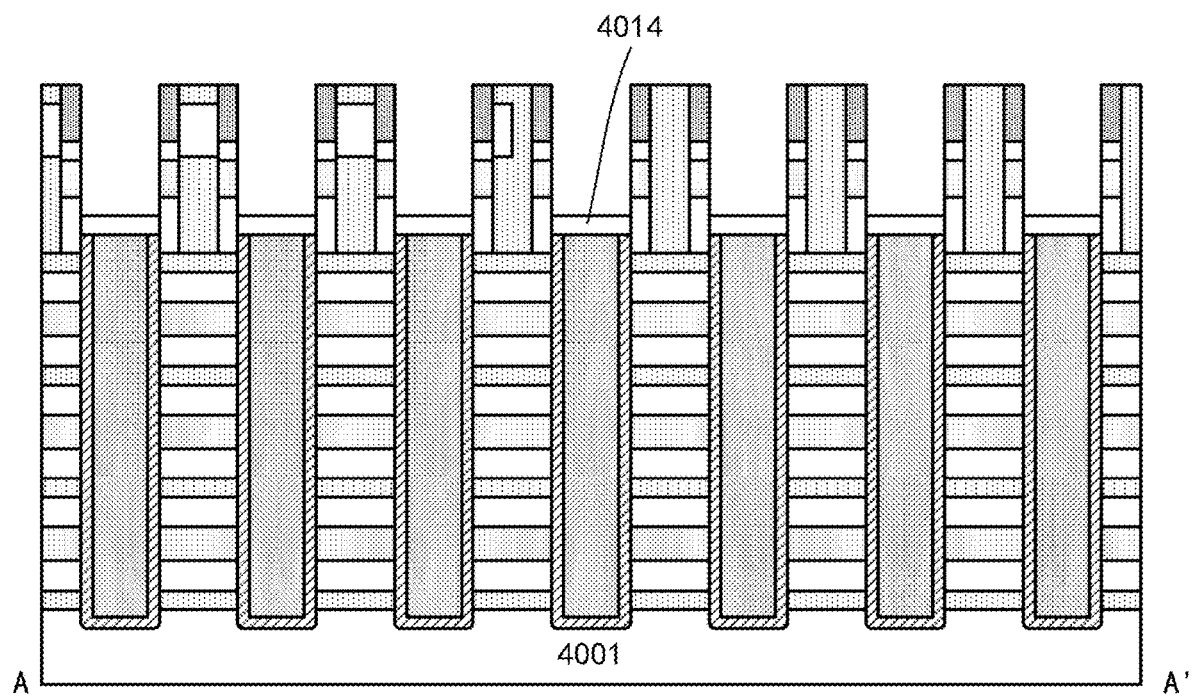

Considering the electrical connection between the gate stack of the selection transistor and the gate stack of the memory cell, as shown in FIG. 16, a gate stack connecting portion 4014 for selection transistor and memory cell may be formed in each processing channel T. The gate stack connecting portion 4014 for selection transistor and memory cell may contain a conductive material, for example, a metal such as tungsten (W). The gate stack connecting portion 4014 for selection transistor and memory cell may be formed by, for example, deposition followed by etching back. The gate stack connecting portion 4014 for selection transistor and memory cell may be a conductive layer on a top surface of the gate stack of the memory cell in each processing channel T. The conductive layer is in contact with the gate stack of the memory cell (especially the gate conductor layer 4027 therein) at a bottom surface, and in contact with the first source/drain layer $4007_4$ at a side surface. A top surface of the gate stack connecting portion 4014 for selection transistor and memory cell may be lower than a top surface of the first source/drain layer $4007_4$.

Figure 17:
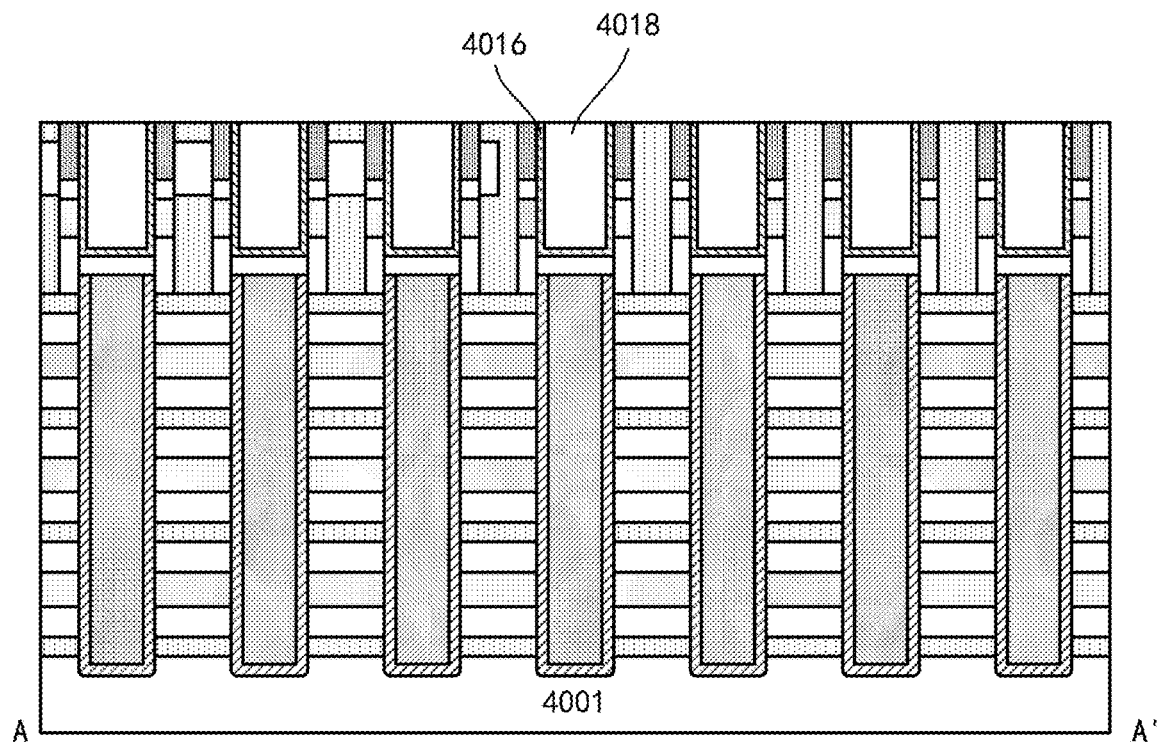

As shown in FIG. 17, the gate stack of the selection transistor may be formed on the gate stack connecting portion 4014 for selection transistor and memory cell in each processing channel T. As described above with reference to FIG. 11, a gate dielectric layer 4016 and a gate conductor layer 4018 may be formed in sequence. Here, the gate stack (4016/4018) of the selection transistor may not have a memory function. For example, the gate dielectric layer 4016 may contain an oxide or a high-k dielectric, and the gate conductor layer 4018 may contain (doped) polycrystalline silicon or metal.

The gate stack (4016/4018) of the selection transistor is surrounded by the selection device layer (the first source/drain layer $4007_4$, the channel layer $4005_4$ and the second source/drain layer $4009_4$), thereby defining the selection transistor. The upper source/drain region (the second source/drain layer $4009_4$) of the selection transistor is electrically connected to the word line 4013, and the lower source/drain region (the first source/drain layer $4007_4$) of the selection transistor is electrically connected to the gate stack (4025/4027) of the corresponding memory cell string via the gate stack connecting portion 4014 for selection transistor and memory cell.

In this way, the fabrication of devices (including memory cells and selection transistors) in the device region is completed.

Then, various electrical contact portions may be fabricated (in the contact region) to achieve desired electrical connections.

A stepped structure may be formed in the contact region to achieve an electrical connection to each memory device layer. Such a stepped structure may be formed in various manners in the art. According to the embodiments of the present disclosure, the stepped structure may be formed as follows, for example.

Figure 18A:
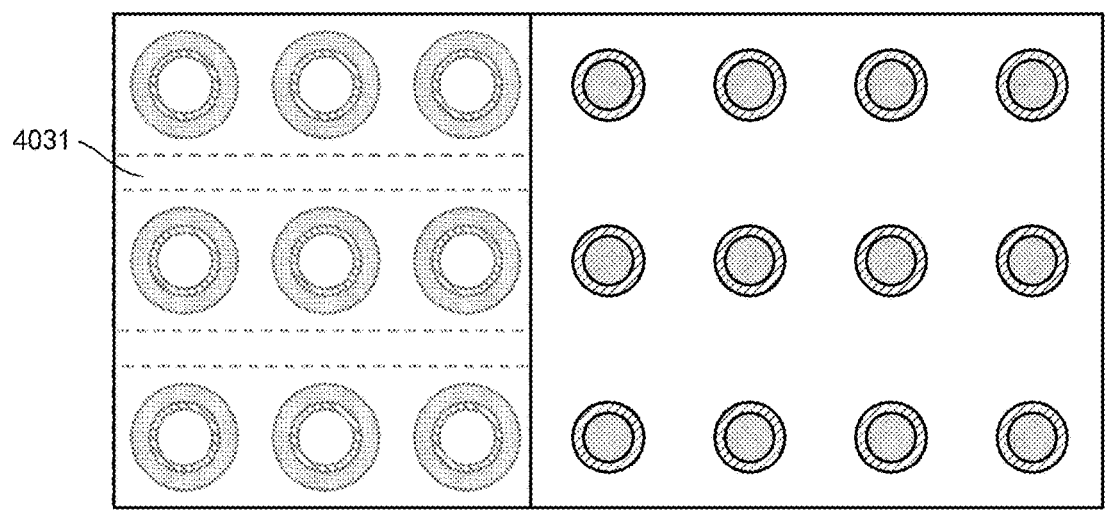
Figure 18B:
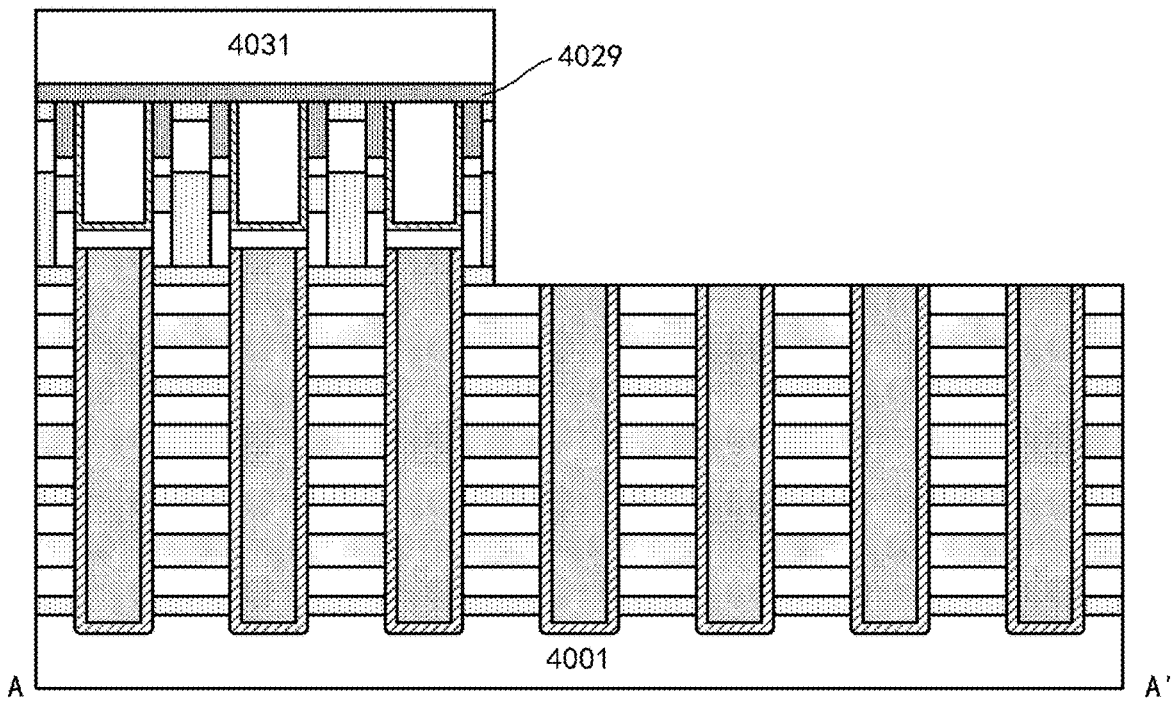

As shown in FIG. 17, the gate stack (of the selection transistor) is now exposed. In order to protect the gate stack (in the device region) when forming the stepped structure, a further hard mask layer 4029 may be formed on an isolation layer 4012', as shown in FIG. 18(a) and FIG. 18(b). For example, the hard mask layer 4029 may contain a nitride. A photoresist 4031 may be formed on the hard mask layer 4029 and patterned by photolithography to shield the device region and expose the contact region. With the photoresist 4031 as an etching mask, the hard mask layer 4029 and the spacer 4010 (both are nitrides in this example), the isolation layer 4012' and the isolation layer $4023_4$ (both are oxides in this example), the selection device layer (which is Si in this example) and the gate stack (and possible word line 4013) may be etched by selective etching such as RIE, so as to expose the memory device layer. An etching order of these layers may change according to processes. An etching depth may be controlled so that a surface exposed by the photoresist 4031 in the contact region after etching is substantially flat. Then, a step is formed between the contact region and the device region. After that, the photoresist 4031 may be removed.

Figure 19A:
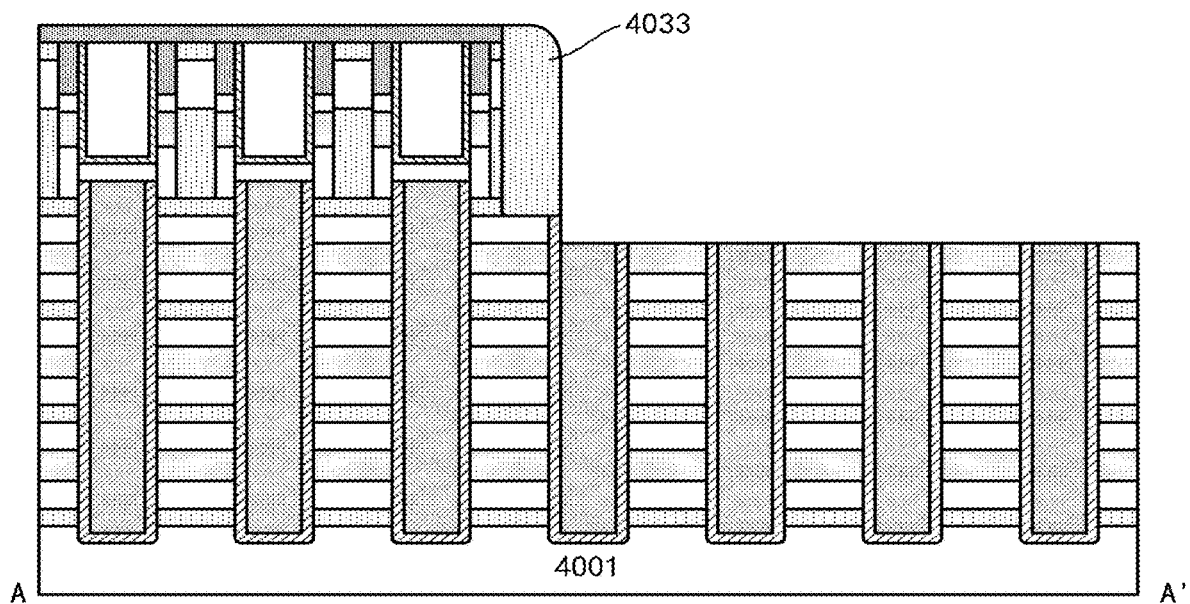
Figure 19B:
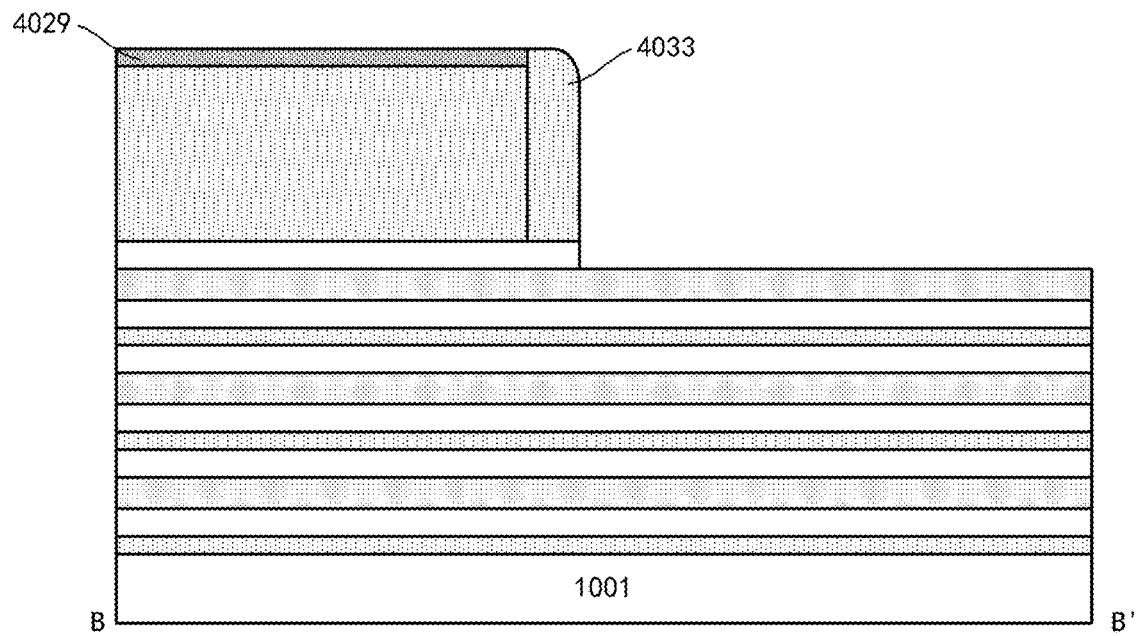

As shown in FIG. 19(a) and FIG. 19(b), a spacer 4033 may be formed at the step between the contact region and the device region by a spacer forming process. The spacer 4033 may contain, for example, an oxide. A width of the spacer 4033 (in the horizontal direction in FIG. 19(a) and FIG. 19(b)) may define a size of a landing pad of a subsequent contact portion to the source/drain region $4009_3$ in the device layer $4005_3$.

With the spacer 4033 formed in this manner as an etching mask, the exposed source/drain region $4009_3$ in the device layer $4005_3$ and the gate stack may be etched by a selective etching such as RIE, so as to expose the channel region in the device layer $4005_3$. An etching depth may be controlled so that a surface exposed by the spacer 4033 in the contact region after etching is substantially flat. For example, the source/drain region $4009_3$ and the gate conductor layer 4027 (for example, Si and polycrystalline silicon respectively) may be etched firstly (if the gate conductor layer 4027 includes a metal gate, the source/drain region $4009_3$ and the gate conductor layer 4027 may be etched separately), and the etching may stop at the channel region in the device layer $4005_3$. After such etching, a top end of the memory functional layer 4025 may protrude above the channel region in the device layer $4005_3$ and may be removed by RIE. In this way, another step is formed between the source/drain region $4009_3$ in the device layer $4005_3$ and the surface exposed by the spacer 4033 in the contact region.

Figure 20A:
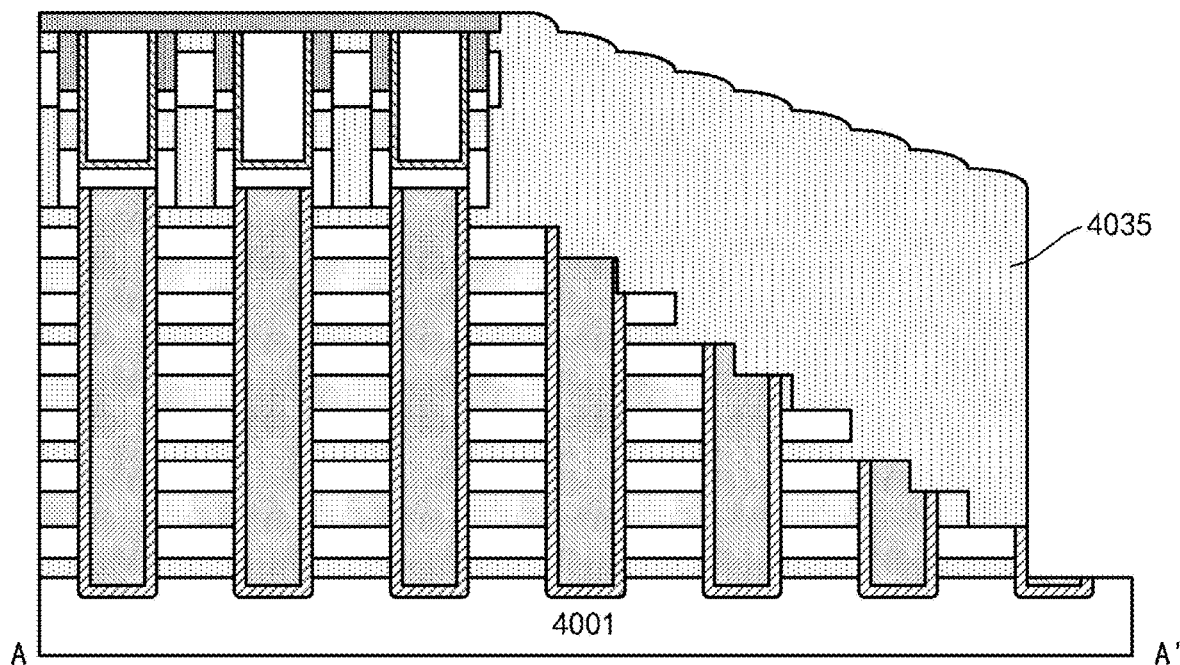
Figure 20B:
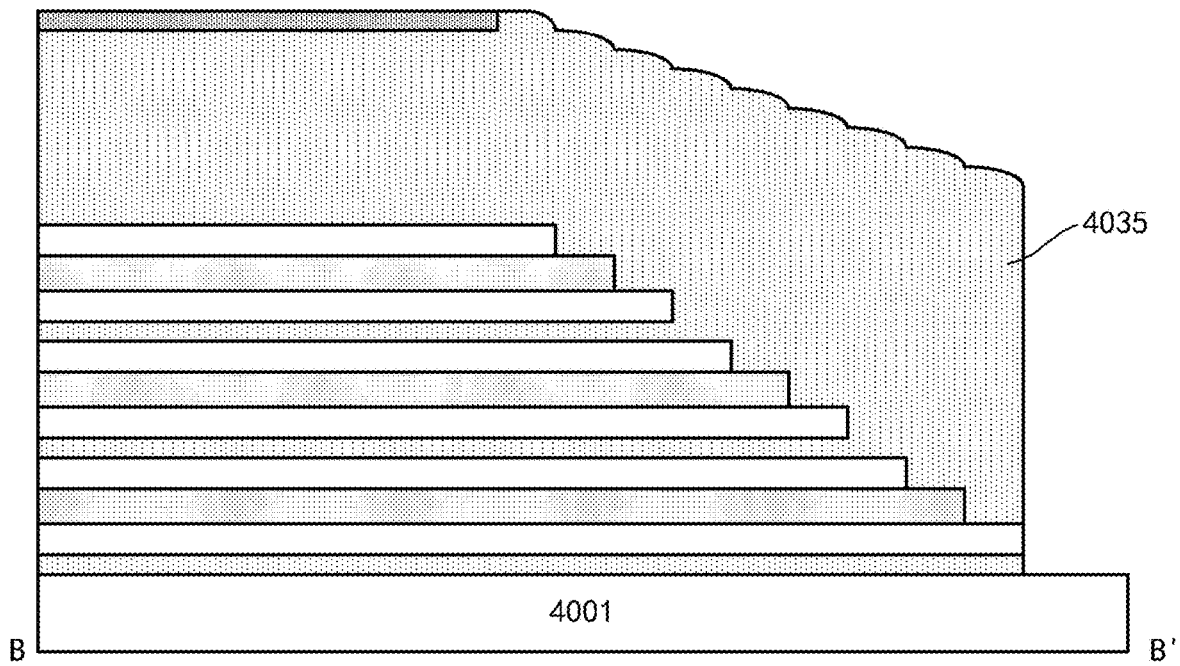

The processes described above with reference to FIG. 19(a) and FIG. 19(b) may be repeatedly performed to form a plurality of steps in the contact region by forming spacers and etching with the spacers as etching masks, as shown in FIG. 20(a) and FIG. 20(b). Such steps form such a stepped structure that in each memory device layer, each layer to be electrically connected such as the source/drain region and optionally channel region, has an end portion protruded with respect to the upper region, so as to define a landing pad of a contact portion to the region. A portion of each formed spacer being left after processing is denoted by 4035 in FIGS. 20(a) and 20(b). Since both the spacer 4035 and the isolation layer are oxide, they are shown here as integral.

After that, the contact portions may be fabricated.

Figure 21A:
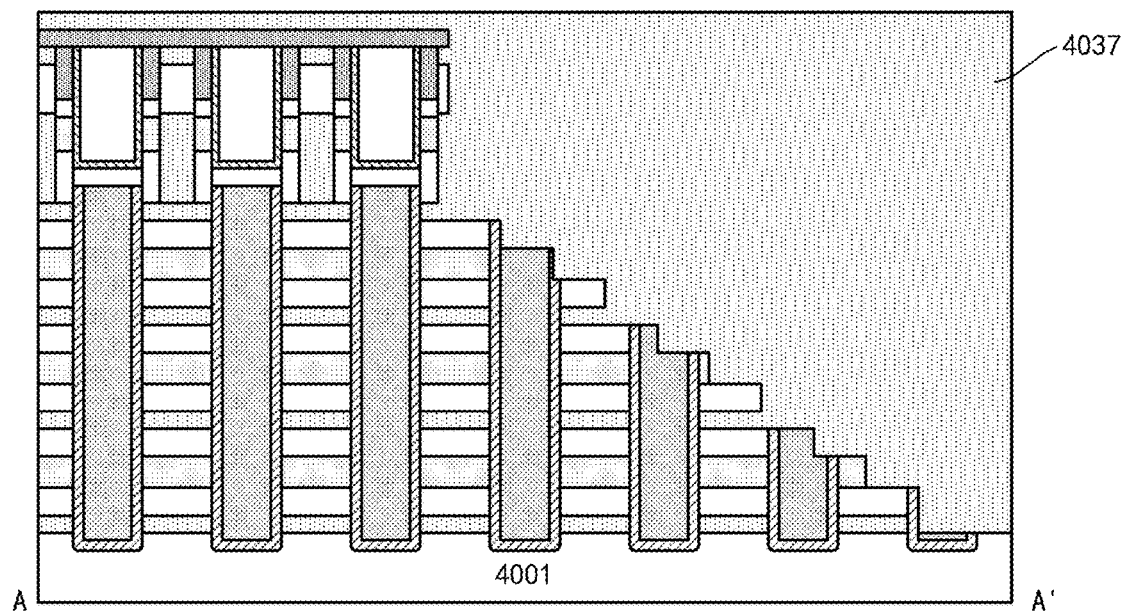
Figure 21B:
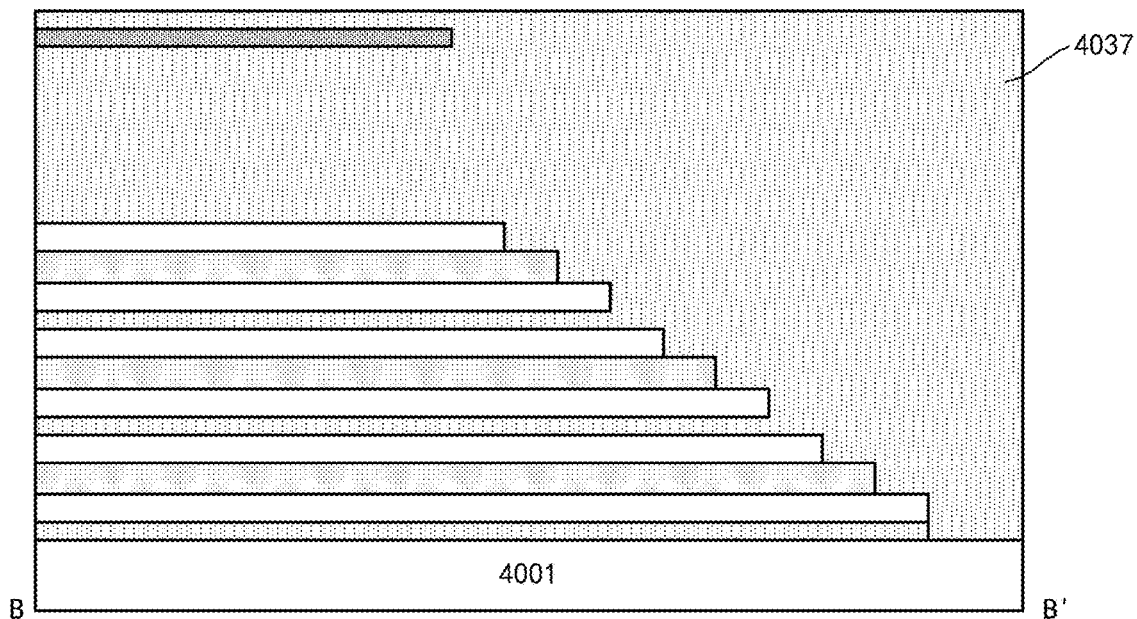
Figure 22A:
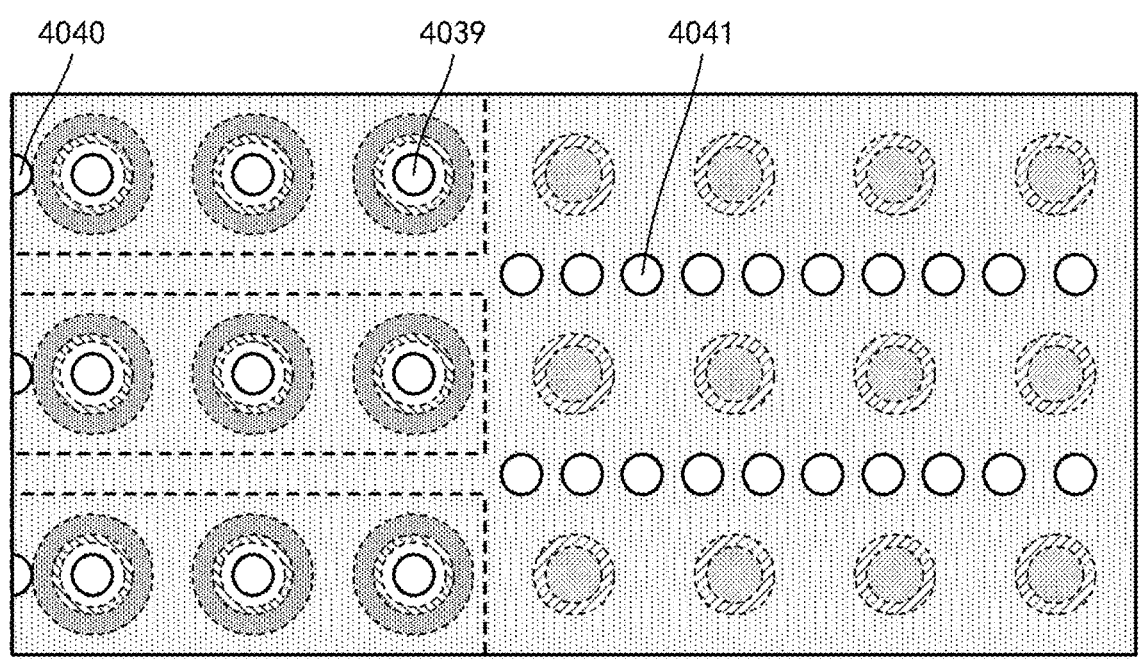
Figure 22B:
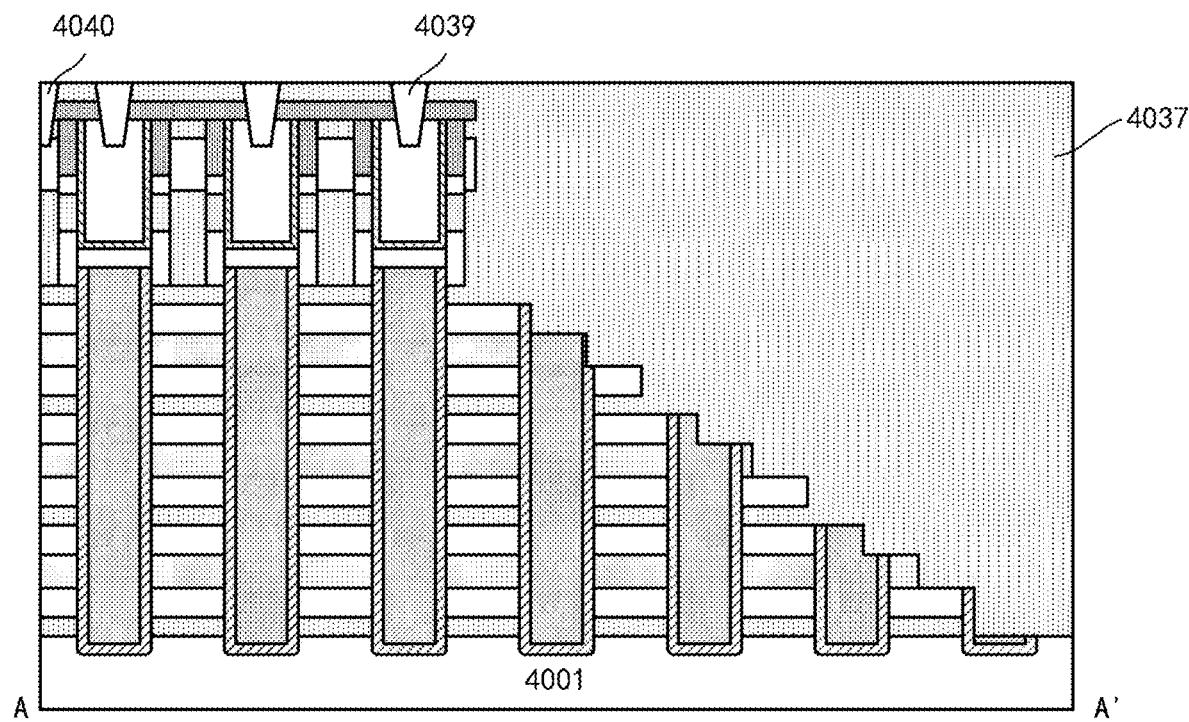
Figure 22C:
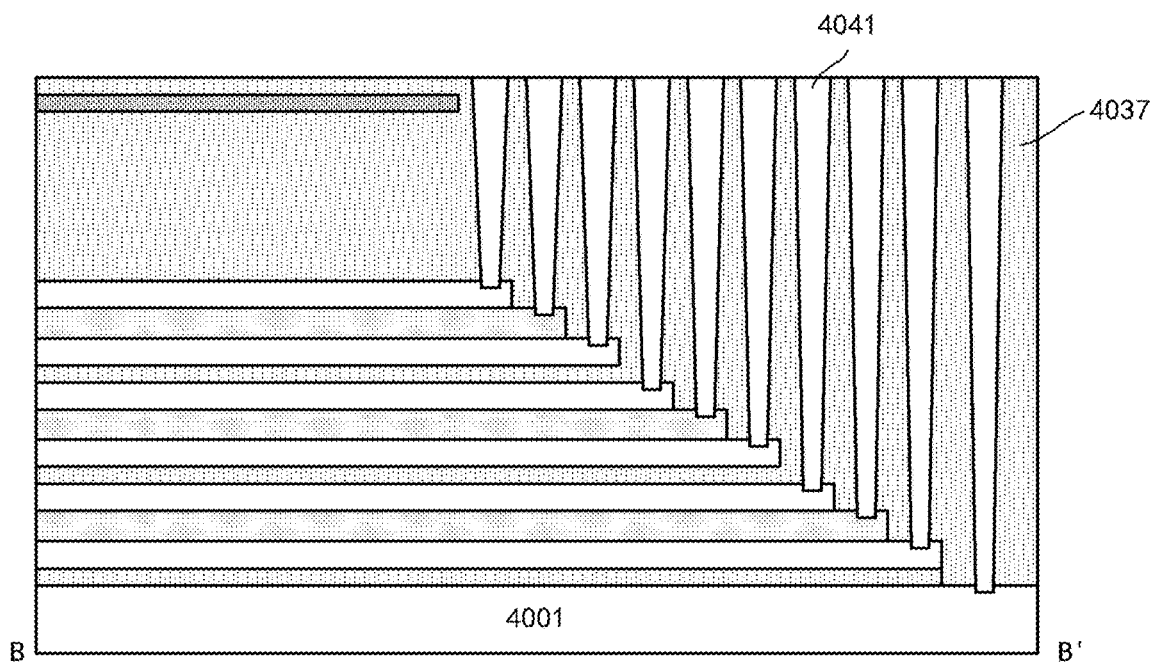

For example, as shown in FIG. 21(a) and FIG. 21(b), an interlayer insulation layer 4037 may be formed by depositing an oxide and performing a planarization such as CMP. Here, the preceding isolation layers and the spacer 4035 are shown as being integral with the interlayer insulation layer 4037 as they are all oxides. Then, as shown in FIG. 22(a), FIG. 22(b) and FIG. 22(c), contact portions 4039, 4040 and 4041 may be formed in the interlayer insulation layer 4037. Specifically, the contact portion 4039 may be formed in the device region and may be electrically connected to the gate conductor layer 4018 in the gate stack of the selection transistor; the contact portion 4040 (partially shown in the figure due to a paper limitation) may be formed in the device layer and may be electrically connected to the word line 4013; the contact portion 4041 may be formed in the contact region and may be electrically connected to the source/drain region and optionally channel region of each memory cell. The contact portion 4041 in the contact region may bypass the gate stack left in the contact region. These contact portions may be formed by etching the interlayer insulation layer 4037 to obtain holes and filling the holes with a conductive material such as a metal.

For each two adjacent memory cells in the vertical direction, the source/drain regions located in the middle, that is, the source/drain region $4009_1$ in the first memory device layer $4005_1$ and the source/drain region $4007_2$ in the second memory device layer $4005_2$ (and the source/drain region $4009_3$ in the third memory device layer $4005_3$ and a lower source/drain region (not shown) of the fourth memory device layer located above the third memory device layer $4005_3$ (if any)) may be electrically connected to the source line (which may be a common source line) via the contact portion 4041; the source/drain regions located at the upper and lower ends, that is, the source/drain region $4007_1$ in the first memory device layer $4005_1$ and the source/drain region $4009_2$ in the second memory device layer $4005_2$ (and the source/drain region $4007_3$ in the third memory device layer $4005_3$ and an upper source/drain region of the fourth memory device layer located above the third memory device layer $4005_3$) may be electrically connected to the bit lines respectively via the contact portion 4041. Then, a NOR-type configuration may be obtained. Here, a contact portion to the channel region is further formed. Such contact portion may be referred to as a bulk contact portion and may receive a bulk bias, so as to adjust the threshold voltage of the device.

Here, two memory cells adjacent in the vertical direction are configured such that the source/drain regions located near in interface between the two memory cells are electrically connected to the source line, so that a number of wires may be reduced. However, the present disclosure is not limited thereto. For example, memory cells adjacent in the vertical direction may have the same configuration, i.e. a configuration of source region-channel region-drain region, or a configuration of drain region-channel region-source region.

In such embodiments, the isolation layer containing the dopant (used as the solid phase dopant source layer) is reserved. However, the present disclosure is not limited thereto. After the diffusion doping, the solid phase dopant source layer may be replaced by other materials. For example, the solid phase dopant source layer may be replaced by other dielectric materials, particularly dielectric materials that do not intentionally contain dopants, so as to improve an isolation performance. Alternatively, each two device layers adjacent in the vertical direction are taken as a group. The solid phase dopant source layer between the device layers of each group (for example, the solid phase dopant source layer $4023_2$ between a group of the device layers $4005_1$ and $4005_2$) may be replaced by a conductive material such as a metal or a doped semiconductor layer, so as to reduce an interconnection resistance (to the source line). The solid phase dopant source layers on upper and lower sides of each group (for example, the solid phase dopant source layer $4023_1$ on a lower side of the group of device layers $4005_1$ and $4005_2$, and the solid phase dopant source layer $4023_3$ on an upper side of the group of device layers $4005_1$ and $4005_2$) may be replaced by dielectric materials to achieve an isolation between the bit lines. In a case of replacing the solid phase dopant source layer, the above-mentioned "interface layer" having the sharp change in doping concentration may also be formed on a side of the source/drain region facing away from the channel region.

Figure 23A:
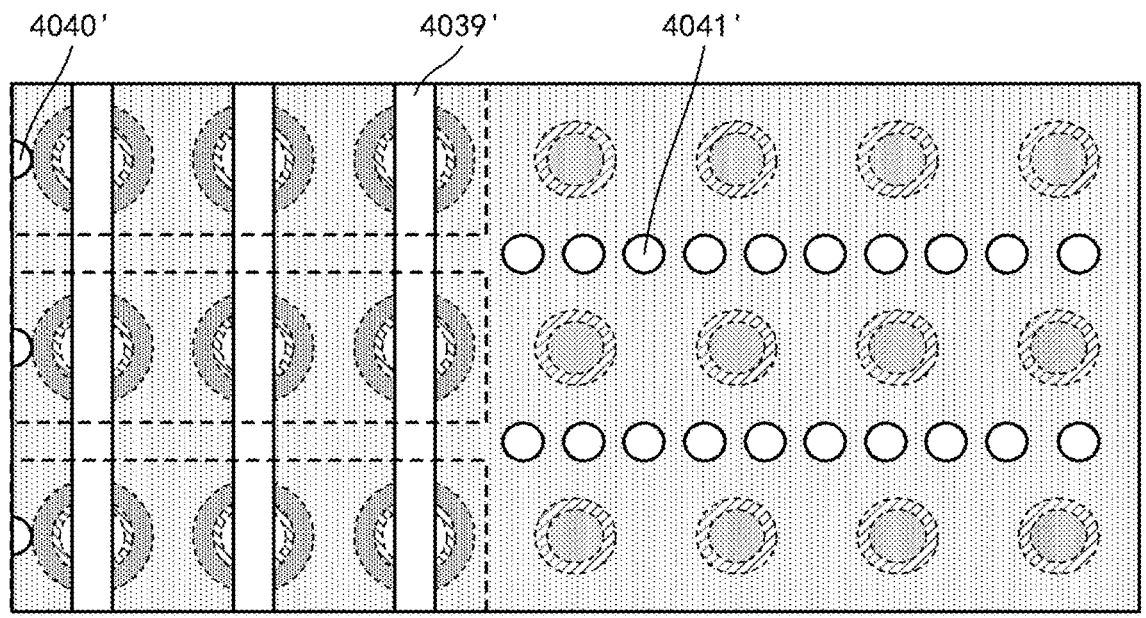
Figure 23B:
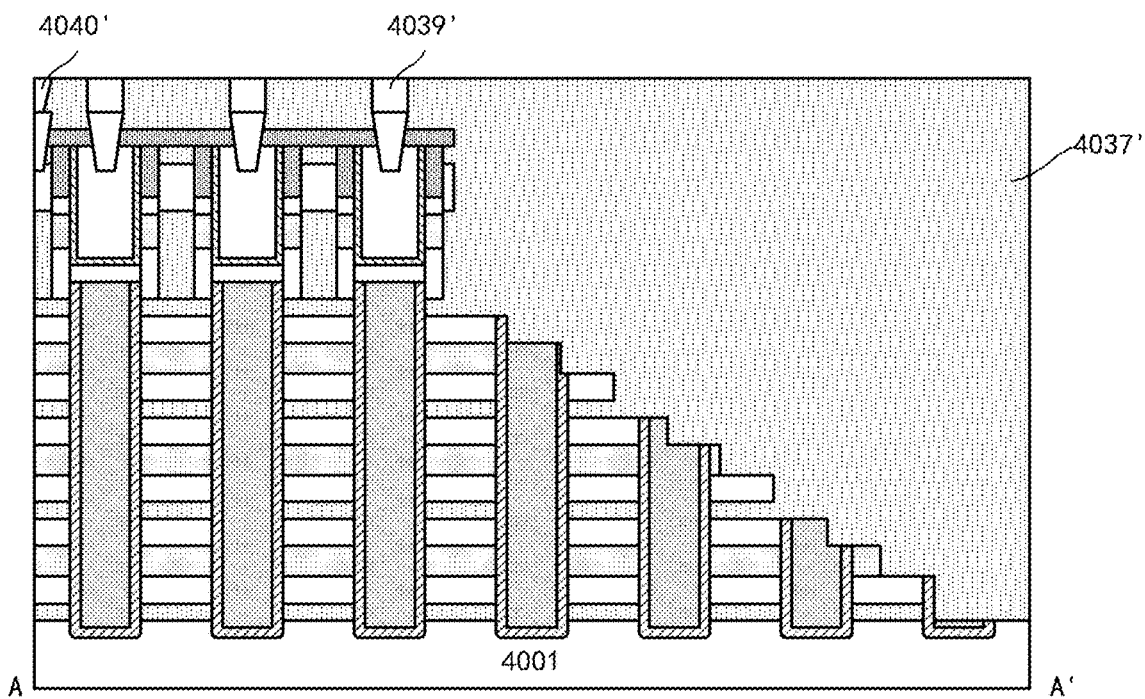
Figure 23C:
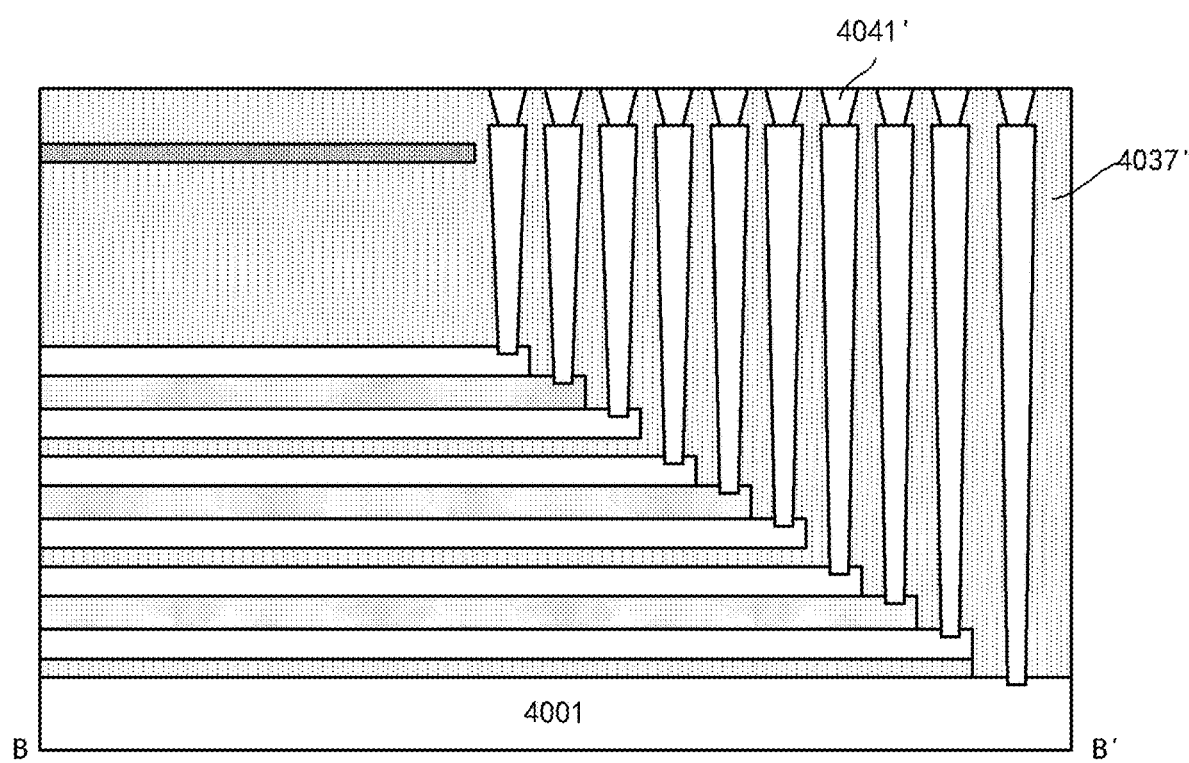

As shown in FIG. 23(a), FIG. 23(b) and FIG. 23(c), an interlayer insulation layer (shown as 4037' integrally with the interlayer insulation layer 4037) may be further formed on the interlayer insulation layer 4037. A plurality of selection lines 4039' extending in the second direction and arranged in the first direction may be formed in the interlayer insulation layer. Therefore, each word line 4013 may be electrically connected to a row of selection transistors (in the first direction), and each selection line 4039' may be electrically connected to a column of selection transistors (in the second direction). A selection of the memory cell string may be achieved through the word lines 4013 and the selection lines 4039'. Certainly, contact plugs 4040' and 4041' electrically connected to the contact portions 4040 and 4041 are further formed in the interlayer insulation layer.

Figure 25:
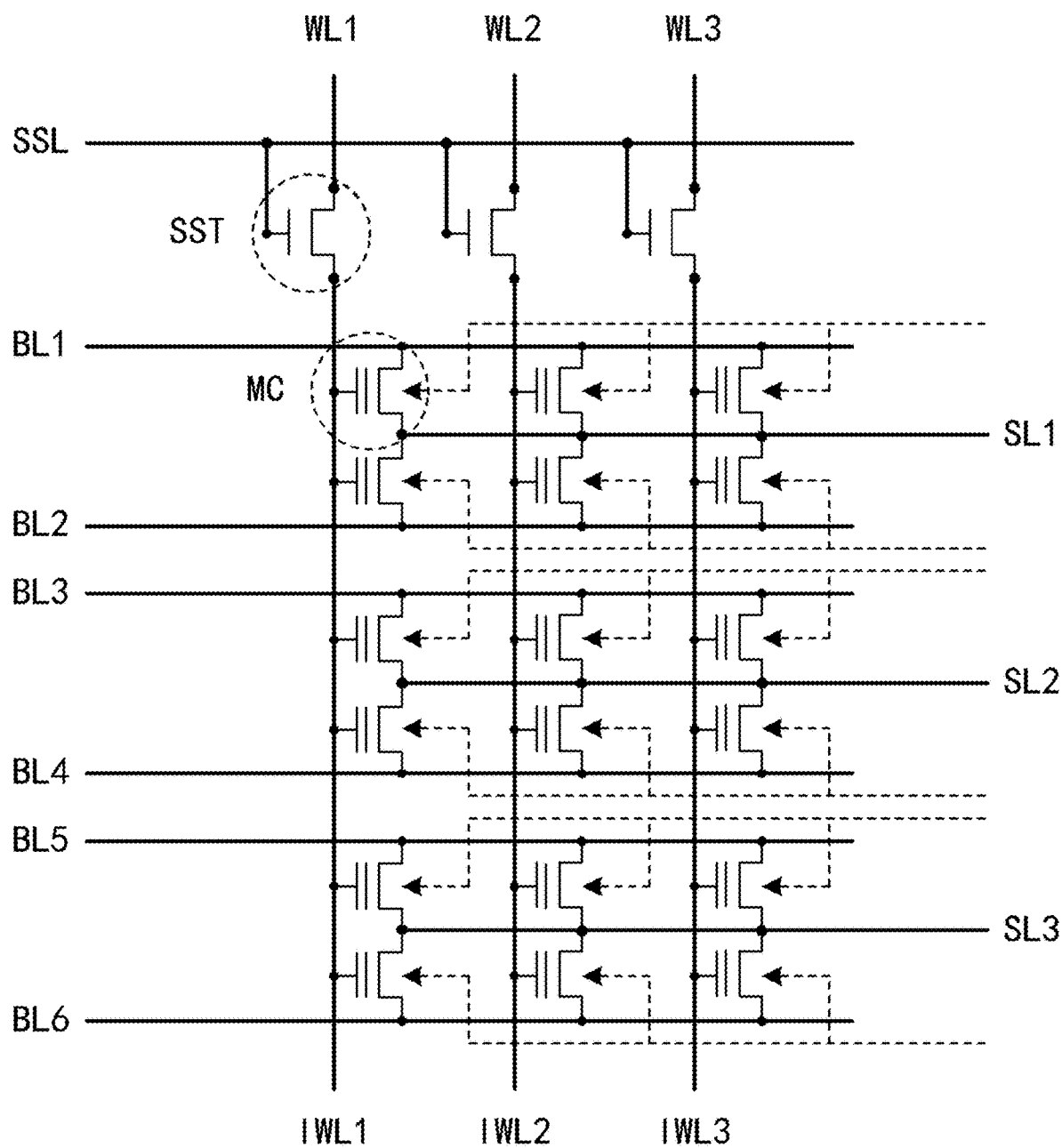
FIG. 25 schematically shows an equivalent circuit diagram of a NOR cell array according to other embodiments of the present disclosure.

FIG. 25 schematically shows an equivalent circuit diagram of a NOR-type memory device according to the embodiments of the present disclosure.

In the example of FIG. 25, three internal word lines IWL1, IWL2 and IWL3 and six bit lines BL1, BL2, BL3, BL4, BL5 and BL6 are schematically shown. However, the specific numbers of the bit lines and the internal word lines are not limited to this. A memory cell MC is provided at an intersection of the bit line and the internal word line. FIG. 25 further shows three source lines SL1, SL2 and SL3. As described above, each two adjacent memory device layers may share the same source line connection. In addition, the source lines may be connected to each other, so that the memory cells MC may be connected to the common source line. In addition, an optional bulk connection to each memory cell is schematically shown by a dashed line in FIG. 25. The bulk connection to each memory cell may be electrically connected to the source line connection of the memory cell.

The internal word lines IWL1 to IWL3 in FIG. 25 may correspond to the gate stacks of memory cells as described above. Adjacent bit lines are isolated from each other in the vertical direction with respect to the substrate.

Each memory cell string or the internal word lines IWL1 to IWL3 may have a selection transistor SST on top and may be connected to the corresponding word lines WL1, WL2 and WL3 via the selection transistor SST. A gate electrode of the selection transistor SST may be connected to a selection line SSL.

Here, for convenience of illustration only, a two-dimensional array of memory cells MC is shown. A plurality of such two-dimensional arrays may be arranged in a direction (for example, a direction perpendicular to the paper surface in the figure) intersecting the two-dimensional array, thereby obtaining a three-dimensional array. Accordingly, a plurality of selection lines SSL may be provided in that direction.

Figure 24A:
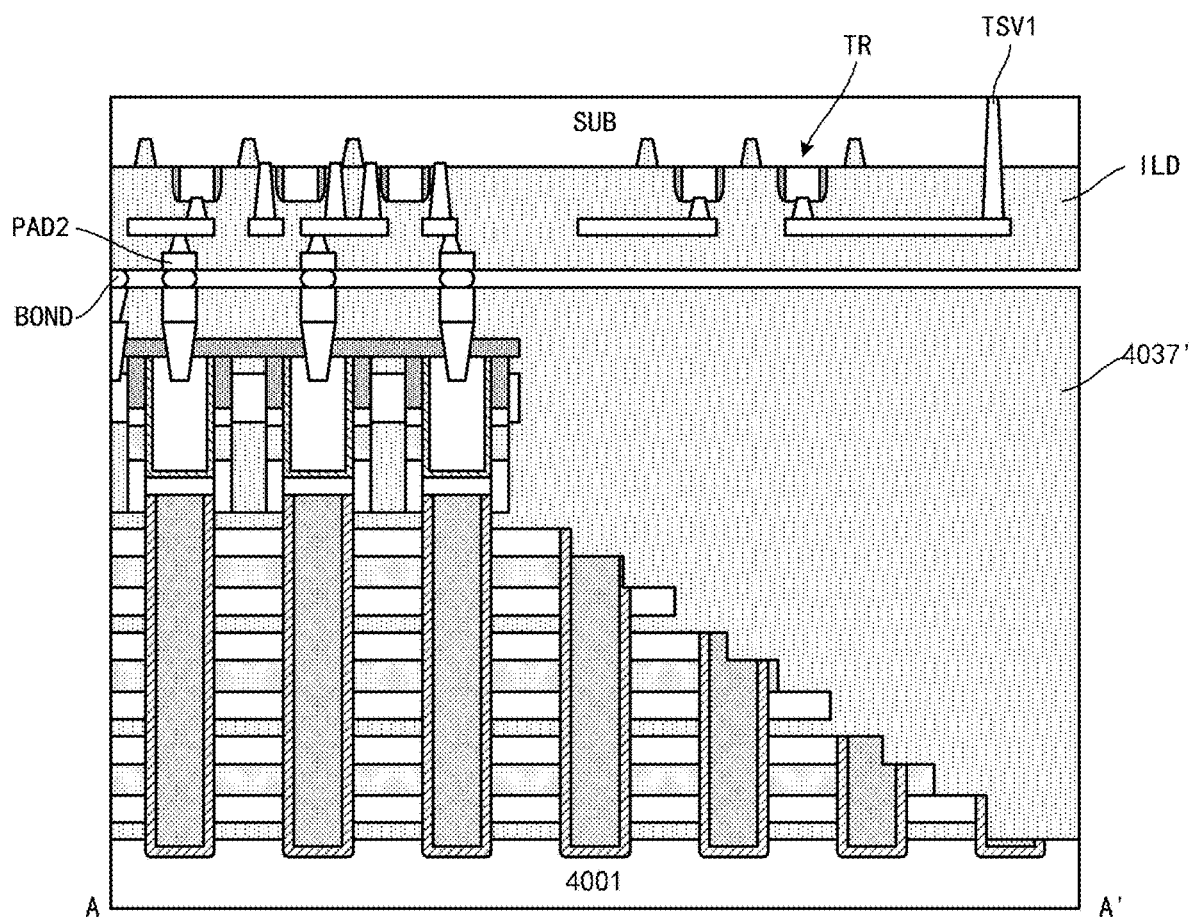
Figure 24B:
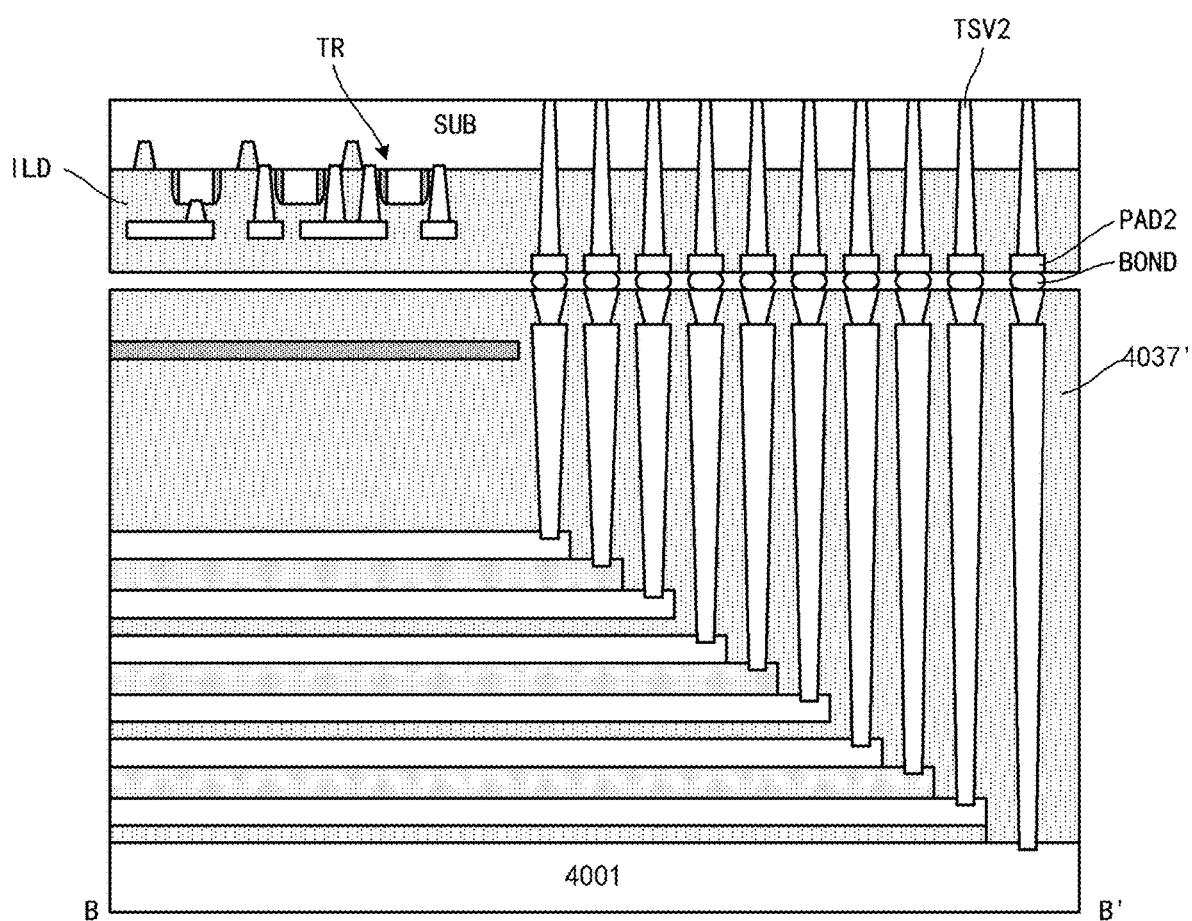

As shown in FIG. 24(a) and FIG. 24(b), a peripheral circuit may be flip-chip mounted on the NOR cell array shown in FIG. 23(a) to FIG. 23(c). As for the peripheral circuit, reference may be made to the above descriptions with reference to FIG. 2(a) and FIG. 2(b). FIG. 24(a) and FIG. 24(b) show that the selection line 4039' and the contact plugs 4040' and 4041' are bonded with the bonding pads PAD2 of the peripheral circuit through the bonding components BOND. However, the present disclosure is not limited thereto. For example, bonding pads may be provided on at least some of the selection line 4039' and the contact plugs 4040' and 4041', so as to be bonded with the bonding pads PAD2. In addition, as described above, it is possible to directly bond and omit the bonding components BOND.

The memory device according to the embodiments of the present disclosure may be applied to various electronic apparatuses. For example, the memory device may store various programs, applications and data required for operations of the electronic apparatus. The electronic apparatus may further include a processor in cooperation with the memory device. For example, the processor may operate the electronic apparatus by executing a program stored in the memory device. The electronic apparatus may include, for example, a smart phone, a personal computer (PC), a tablet computer, an artificial intelligence device, a wearable device, a mobile power supply, or the like.

In the above descriptions, the technical details such as patterning and etching of each layer have not been described in detail. However, those skilled in the art should understand that various technical means may be employed to form a layer, a region, etc. having a desired shape. In addition, in order to form the same structure, those skilled in the art may further design a method that is not completely the same as the method described above. In addition, although the various embodiments are described above separately, this does not mean that the measures in the various embodiments may not be advantageously used in combination.

The embodiments of the present disclosure have been described above. However, these embodiments are for illustrative purposes only, and are not intended to limit the scope of the present disclosure. The scope of the present disclosure is defined by the appended claims and their equivalents. Those skilled in the art may make various substitutions and modifications without departing from the scope of the present disclosure, and these substitutions and modifications should all fall within the scope of the present disclosure.

What is claimed is:

1. A NOR-type memory device, comprising:
   a NOR cell array, comprising:
      a first substrate;
      an array of memory cells on the first substrate, wherein each memory cell comprises a first gate stack extending vertically with respect to the first substrate and an active region surrounding a periphery of the first gate stack, wherein in a plan view, the first gate stacks are arranged in an array in a first direction and a second direction intersecting the first direction;
      selection transistors above the array of memory cells, wherein the selection transistors correspond to the first gate stacks, each selection transistor comprises a second gate stack vertically extending on the corresponding first gate stack and an active region surrounding a periphery of the second gate stack, and the active region comprises a first source/drain region, a channel region and a second source/drain region that are disposed in sequence in a vertical direction;
      connecting portions electrically connecting the first source/drain regions to the first gate stacks;
      a plurality of word lines extending in the first direction and arranged in the second direction, wherein the plurality of word lines are electrically connected to the second source/drain regions of corresponding rows of selection transistors respectively;

a plurality of selection lines extending in the second direction and arranged in the first direction, wherein the plurality of selection lines are electrically connected to the second gate stacks of corresponding columns of selection transistors respectively, and;

second bonding pads electrically connected to the active regions of the memory cells, and a peripheral circuit, comprising:

a second substrate;

peripheral circuit elements on the second substrate; and third bonding pads, wherein at least one or more of the third bonding pads is electrically connected to the peripheral circuit elements, wherein the NOR cell array and the peripheral circuit are arranged such that at least one or more of the selection lines and the second bonding pads is opposite to at least one or more of the third bonding pads.

2. The NOR-type memory device according to claim 1, wherein the NOR cell array further comprises a first interlayer insulation layer on the first substrate, wherein the first interlayer insulation layer covers the array of memory cells, and the selection lines and the second bonding pads are exposed on a surface of the first interlayer insulation layer facing away from the first substrate, wherein the peripheral circuit further comprises a second interlayer insulation layer on the second substrate, wherein the second interlayer insulation layer covers the peripheral circuit elements, and the third bonding pads are exposed on a surface of the second interlayer insulation layer facing away from the second substrate, and wherein the NOR cell array and the peripheral circuit are arranged such that the surface of the first interlayer insulation layer is opposite to the surface of the second interlayer insulation layer.

3. The NOR-type memory device according to claim 1, wherein the first substrate comprises a device region and a contact region, and the memory cells are formed in the device region, and wherein the NOR cell array further comprises:

first contact portions formed on the device region of the first substrate, wherein the selection lines are electrically connected to the first gate stacks by the first contact portions; and second contact portions formed on the contact region of the first substrate, wherein the second bonding pads are electrically connected to the active regions by the second contact portions.

4. The NOR-type memory device according to claim 1, wherein the at least one or more of the selection lines and the second bonding pads is connected to the at least one or more of the third bonding pads by bonding components; or wherein the at least one or more of the selection lines and the second bonding pads are directly bonded with the at least one or more of the third bonding pads.

5. The NOR-type memory device according to claim 4, wherein the bonding component comprises a bump and/or a solder ball.

6. The NOR-type memory device according to claim 1, wherein the peripheral circuit further comprises through silicon vias TSVs extending through the second substrate, and one or more of the third bonding pads is disposed on corresponding one or more of the TSVs.

7. The NOR-type memory device according to claim 3, wherein the active region comprises:

a first source/drain layer, a first channel layer and a second source/drain layer that are stacked in sequence in a vertical direction, wherein the first source/drain layer, the first channel layer and the second source/drain layer extend from the device region to the contact region, and wherein the second contact portion comprises a second contact portion landing on the first source/drain layer and the second source/drain layer.

8. The NOR-type memory device according to claim 7, wherein the second contact portion further comprises a second contact portion landing on the first channel layer.

9. The NOR-type memory device according to claim 7, wherein the first source/drain layer, the first channel layer and the second source/drain layer form a stepped structure in the contact region.

10. The NOR-type memory device according to claim 7, wherein the active region further comprises:

a second channel layer and a third source/drain layer that are stacked in sequence on the second source/drain layer, wherein the second channel layer and the third source/drain layer extend from the device region to the contact region, and wherein the second contact portion comprises a second contact portion landing on the third source/drain layer.

11. The NOR-type memory device according to claim 10, wherein the second contact portion further comprises a second contact portion landing on the second channel layer.

12. The NOR-type memory device according to claim 10, wherein the first source/drain layer, the first channel layer, the second source/drain layer, the second channel layer and the third source/drain layer form a stepped structure in the contact region.

13. The NOR-type memory device according to claim 3, wherein the active region comprises:

a semiconductor nanosheet extending along a periphery of the first gate stack, wherein the semiconductor nanosheet comprises a first source/drain region, a first channel region and a second source/drain region that are arranged in sequence in a vertical direction, and the NOR-type memory device further comprises:

a first interconnection layer surrounding a periphery of the first source/drain region of the semiconductor nanosheet and extending from the device region to the contact region; and a second interconnection layer surrounding the periphery of the second source/drain region of the semiconductor nanosheet and extending from the device region to the contact region, wherein the second contact portion comprises a second contact portion landing on the first interconnection layer and the second interconnection layer.

14. The NOR-type memory device according to claim 13, wherein the first interconnection layer and the second interconnection layer form a stepped structure in the contact region.

15. The NOR-type memory device according to claim 13, wherein the semiconductor nanosheet further comprises:

a second channel region and a third source/drain region that are arranged in sequence on the second source/drain region in the vertical direction, and the NOR-type memory device further comprises:

a third interconnection layer surrounding a periphery of the third source/drain region of the semiconductor nanosheet and extending from the device region to the contact region, wherein the second contact portion comprises a second contact portion landing on the third interconnection layer.

16. The NOR-type memory device according to claim 15, wherein the first interconnection layer, the second interconnection layer and the third interconnection layer form a stepped structure in the contact region.

17. The NOR-type memory device according to claim 1, further comprising:

fourth bonding pads electrically connected to the word lines, wherein at least one or more of the fourth bonding pads is opposite to at least one or more of the third bonding pads.

18. The NOR-type memory device according to claim 1, wherein the first gate stack, the connecting portion and the second gate stack are self-aligned in the vertical direction.

19. The NOR-type memory device according to claim 1, wherein the active region contains a monocrystalline semiconductor material.

20. The NOR-type memory device according to claim 7, wherein at least one of the first source/drain layer, the first channel layer and the second source/drain layer surrounds the first gate stack.

21. An electronic apparatus, comprising the NOR-type memory device according to claim 1.

22. The electronic apparatus according to claim 21, wherein the electronic apparatus comprises a smart phone, a personal computer, a tablet computer, an artificial intelligence device, a wearable device, or a mobile power supply.

* * * * *